United States Patent
Suzuki

(10) Patent No.: US 12,471,276 B2
(45) Date of Patent: Nov. 11, 2025

(54) SEMICONDUCTOR STORAGE DEVICE AND METHOD OF MANUFACTURING SEMICONDUCTOR STORAGE DEVICE

(71) Applicant: Kioxia Corporation, Tokyo (JP)

(72) Inventor: Kazutaka Suzuki, Kuwana (JP)

(73) Assignee: Kioxia Corporation, Tokyo (JP)

( * ) Notice: Subject to any disclaimer, the term of this patent is extended or adjusted under 35 U.S.C. 154(b) by 657 days.

(21) Appl. No.: 17/806,545

(22) Filed: Jun. 13, 2022

(65) Prior Publication Data
US 2023/0328974 A1    Oct. 12, 2023

(30) Foreign Application Priority Data
Mar. 22, 2022  (JP) .................. 2022-045388

(51) Int. Cl.
| | | |
|---|---|---|
| H10B 41/27 | (2023.01) | |
| H10B 41/10 | (2023.01) | |
| H10B 41/35 | (2023.01) | |
| H10B 43/10 | (2023.01) | |
| H10B 43/27 | (2023.01) | |
| H10B 43/35 | (2023.01) | |

(52) U.S. Cl.
CPC ............. *H10B 41/27* (2023.02); *H10B 41/10* (2023.02); *H10B 41/35* (2023.02); *H10B 43/10* (2023.02); *H10B 43/27* (2023.02); *H10B 43/35* (2023.02)

(58) Field of Classification Search
CPC ........ H10B 41/27; H10B 41/10; H10B 41/35; H10B 43/10; H10B 43/27; H10B 43/35
See application file for complete search history.

(56) References Cited

U.S. PATENT DOCUMENTS

| | | | |
|---|---|---|---|
| 10,916,563 B2 | 2/2021 | Kim et al. | |
| 2021/0057433 A1* | 2/2021 | Zhang | H01L 21/31111 |
| 2021/0066338 A1 | 3/2021 | Otaguro et al. | |
| 2021/0066339 A1 | 3/2021 | Kadota et al. | |
| 2021/0082947 A1 | 3/2021 | Kobayashi et al. | |
| 2021/0082949 A1 | 3/2021 | Harada et al. | |
| 2022/0059566 A1* | 2/2022 | King | H01L 21/02164 |

* cited by examiner

*Primary Examiner* — Jacob Y Choi
*Assistant Examiner* — Aaron Michael Wegner
(74) *Attorney, Agent, or Firm* — Oblon, McClelland, Maier & Neustadt, L.L.P.

(57) ABSTRACT

A semiconductor storage device according to an embodiment includes a multi-layered body, a first dividing part, a second dividing part, a third dividing part, second columnar bodies, and third columnar bodies. The third dividing part is between the first dividing part and the second dividing part. The third dividing part divides each of gate electrode layers. The third dividing part includes first columnar bodies. The first columnar bodies having insulating properties at least in outer circumferential portions of the first columnar bodies. A width of each of the first columnar bodies is larger than a distance between two second columnar bodies adjacent in a second direction included in the second columnar bodies or larger than a distance between two third columnar bodies adjacent in the second direction included in the third columnar bodies.

9 Claims, 31 Drawing Sheets

SEMICONDUCTOR STORAGE DEVICE AND METHOD OF MANUFACTURING SEMICONDUCTOR STORAGE DEVICE

CROSS-REFERENCE TO RELATED APPLICATION

This application is based upon and claims the benefit of priority from Japanese Patent Application No. 2022-045388, filed Mar. 22, 2022; the entire contents of which are incorporated herein by reference.

FIELD

Embodiments described herein relate generally to a semiconductor storage device and a method of manufacturing the semiconductor storage device.

BACKGROUND ART

A semiconductor storage device including a multi-layered body is known. The multi-layered body has a plurality of insulating layers and a plurality of word lines which are alternately stacked and has a plurality of memory pillars penetrating the multi-layered body in a thickness direction of the multi-layered body.

DETAILED DESCRIPTION

Figure 1:
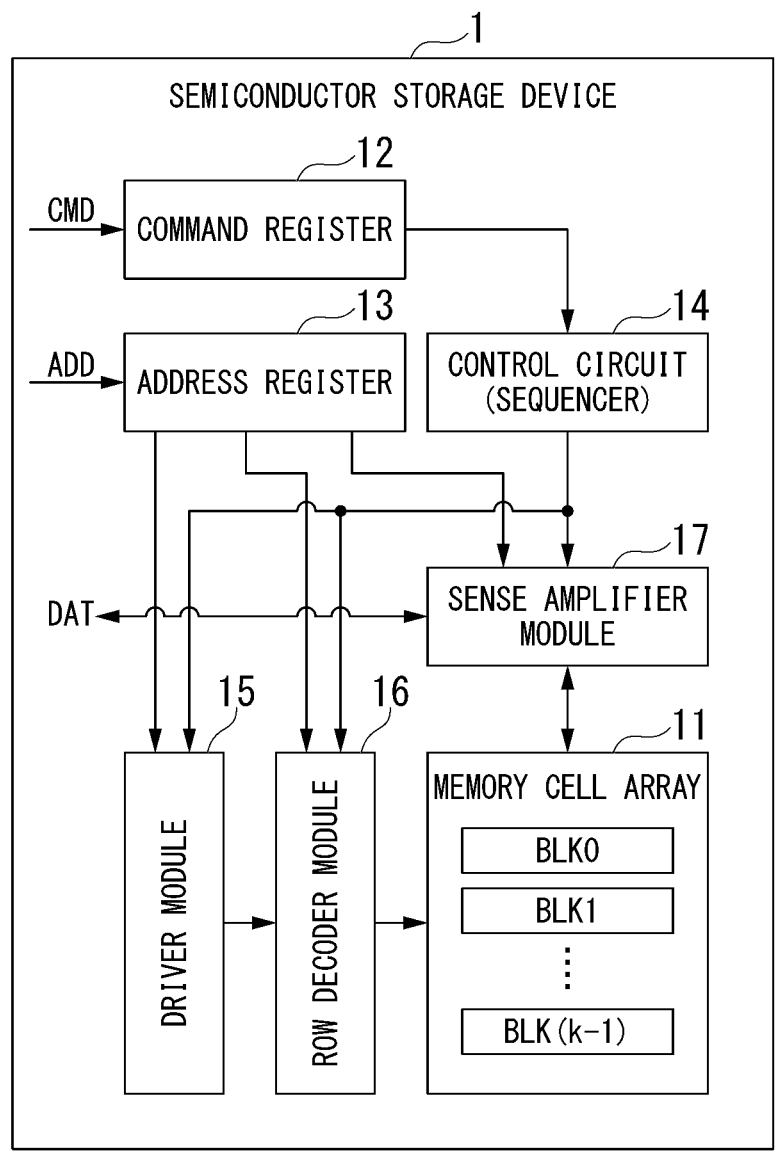
FIG. 1 is a block diagram showing a part of a configuration of a semiconductor storage device according to a first embodiment.

A semiconductor storage device according to an embodiment includes a multi-layered body, a first dividing part, a second dividing part, a third dividing part, a plurality of second columnar bodies, and a plurality of third columnar bodies. The multi-layered body includes a plurality of gate electrode layers and a plurality of insulating layers. The plurality of the gate electrode layers and the plurality of the insulating layers are alternately stacked one layer by one layer in a first direction in the multi-layered body. The first dividing part penetrates the multi-layered body in the first direction. The first dividing part extends in a second direction. The first dividing part divides each of the plurality of the gate electrode layers in a third direction. The second direction is different from the first direction. The third direction is different from the first direction and the second direction. The second dividing part is separated from the first dividing part in the third direction. The second dividing part penetrates the multi-layered body in the first direction. The second dividing part divides each of the plurality of the gate electrode layers in the third direction. The third dividing part is between the first dividing part and the second dividing part. The third dividing part divides each of the plurality of the gate electrode layers in the third direction. The third dividing part includes a plurality of first columnar bodies. The plurality of the first columnar bodies extend in the first direction in the multi-layered body. The plurality of the first columnar bodies have outer circumferential portions. The plurality of the first columnar bodies have insulating properties at least in the outer circumferential portions of the plurality of the first columnar bodies. The plurality of the first columnar bodies are aligned in the second direction. The plurality of the second columnar bodies are between the first dividing part and the third dividing part. The plurality of the second columnar bodies extends in the first direction in the multi-layered body. Each of the plurality of the second columnar bodies includes a charge storage and a channel layer. The plurality of the third columnar bodies are between the second dividing part and the third dividing part. The plurality of the third columnar bodies extend in the first direction in the multi-layered body. Each of the plurality of the third columnar bodies includes a charge storage and a channel layer. A width of each of the plurality of the first columnar bodies in the second direction is larger than a distance between two second columnar bodies adjacent in the second direction included in the plurality of the second columnar bodies. Alternatively, a width of each of the plurality of the first columnar bodies in the second direction is larger than a distance between two third columnar bodies adjacent in the second direction included in the plurality of the third columnar bodies.

Hereinafter, a semiconductor storage device according to the embodiment and a method of manufacturing the semiconductor storage device will be described with reference to the drawings. In the following description, components having the same or similar function are denoted by the same reference signs. Also, duplicate description of the components may be omitted. In the following description, in components having a reference sign to which a number or an alphabetical letter is appended at the end for distinction, the number or the alphabetical letter at the end may be omitted when they do not need to be distinguished from each other. An expression "dimension" in the following embodiments may be read as "width".

"Parallel", "perpendicular", or "the same" may include cases of "substantially parallel", "substantially perpendicular" or "substantially the same". "Connection" is not limited to a mechanical connection and may include an electrical connection. That is, the "connection" is not limited to a case in which a plurality of elements are directly connected, and may include a case in which a plurality of elements are connected with another element interposed therebetween. A "ringed shape" is not limited to an annular shape, and may include a rectangular ringed shape or a triangular ringed shape. "Adjacent to each other" is not limited to a case in which a plurality of elements are in contact with each other, and may include a case in which a plurality of elements are separated from each other (for example, a case in which another element is interposed between a plurality of elements).

First, an X direction, a Y direction, and a Z direction will be defined. The X direction is a direction in which a word line WL (see FIG. 7) to be described later extends. The Y direction is a direction that intersects (for example, is perpendicular to) the X direction. In other words, the Y direction is not parallel to the X direction. The Y direction is a direction in which a bit line BL (see FIG. 4) to be described later extends. The Z direction is a direction that intersects (for example, is perpendicular to) the X direction and the Y direction. In other words, the Z direction is not parallel to the X direction and the Y direction. The Z direction is a stacking direction of a multi-layered body 30 to be described later (see FIG. 4). The 7, direction is an example of a first direction. The X direction is an example of a second direction. The Y direction is an example of a third direction. In the following description, the side on which the bit line BL is positioned with respect to the multi-layered body 30 may be referred to as "upper" and the side opposite thereto may be referred to as "lower". However, these expressions are for convenience only and do not define the direction of gravity. Also, in the drawings described below, an insulating part that is not related to the description may be omitted. In some drawings, hatching indicating a cross section may be partially omitted to make the drawings easier to understand.

First Embodiment

1. Configuration of Semiconductor Storage Device

FIG. 1 is a block diagram showing a part of a configuration of a semiconductor storage device 1. The semiconductor storage device 1 is, for example, a non-volatile semiconductor storage device. The semiconductor storage device 1 is a NAND type flash memory. The semiconductor storage device 1 can be connected to, for example, an external host device. The semiconductor storage device 1 is used as a storage space for the host device. The semiconductor storage device 1 includes, for example, a memory cell array 11, a command register 12, an address register 13, a control circuit (sequencer) 14, a driver module 15, a row decoder module 16, and a sense amplifier module 17.

The memory cell array 11 includes a plurality of blocks BLK0 to BLK (k−1) (k is an integer of 1 or more). The block BLK is a set of a plurality of memory cell transistors that store data non-volatilely. The block BLK is used as a data erasing unit. A plurality of bit lines and a plurality of word lines are provided in the memory cell array 11. Each of the memory cell transistors is associated with one bit line and one word line.

The command register 12 holds a command CMD received by the semiconductor storage device 1 from the host device. The address register 13 holds address information ADD received by the semiconductor storage device 1 from the host device. The control circuit 14 is a circuit that controls various operations of the semiconductor storage device 1. For example, the control circuit 14 executes a write operation, a read operation, an erase operation, or the like of data on the basis of the command CMD held in the command register 12.

The driver module 15 includes a voltage generation circuit and generates voltages used in various operations of the semiconductor storage device 1. The row decoder module 16 transfers a voltage applied to a signal line corresponding to a selected word line to the selected word line. The sense amplifier module 17 applies a desired voltage to each bit line in the write operation. In the read operation, the sense amplifier module 17 determines a data value stored in each memory cell transistor on the basis of a voltage of each bit line, and transfers the determination result as read data DAT to the host device.

2. Configuration of Memory Cell Array

<2.1 Electrical Configuration of Memory Cell Array>

Figure 2:
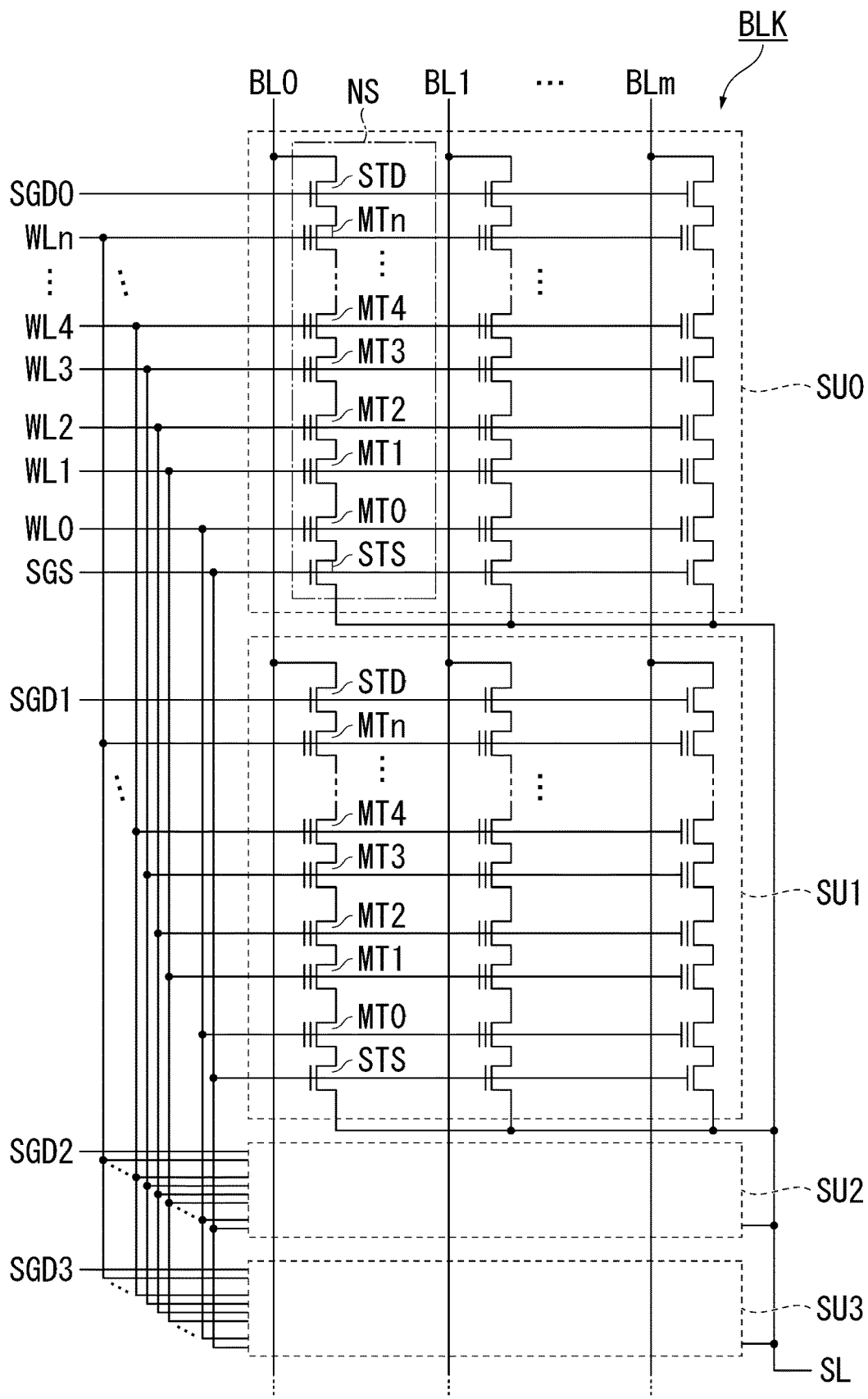
FIG. 2 is a diagram showing an equivalent circuit of a part of a memory cell array according to the first embodiment.

FIG. 2 is a diagram showing an equivalent circuit of a part of the memory cell array 11. FIG. 2 shows one block BLK included in the memory cell array 11. The block BLK includes a plurality (for example, four) of string units SU0 to SU3. Each of the string units SU may also be referred to as a "finger".

Each string unit SU includes a plurality of NAND strings NS. Each of the plurality of the NAND strings NS is associated with bit lines BL0 to BLm (m is an integer of 1 or more). Each NAND string NS includes, for example, a plurality of memory cell transistors MT0 to MTn (n is an integer of 1 or more), one or more drain side selection transistors STD, and one or more source side selection transistors STS.

In each NAND string NS, the memory cell transistors MT0 to MTn are connected in series. Each of the memory cell transistors MT includes a control gate and a charge storage. The control gate of the memory cell transistor MT is connected to any of word lines WL0 to WLn. In each memory cell transistor MT, electric charge is stored in the charge storage according to a voltage applied to the control gate via the word line WL, and thereby data is held non-volatilely.

A drain of the drain side selection transistor STD is connected to the bit line BL corresponding to the NAND string NS. A source of the drain side selection transistor STD is connected to one end of the memory cell transistors MT0 to MTn connected in series. A control gate of the drain side selection transistor STD is connected to any one of drain side selection gate lines SGD0 to SGD3. The drain side selection transistor STD is electrically connected to the row decoder module 16 via the drain side selection gate line SGD. The drain side selection transistor STD connects the NAND string NS and the bit line BL when a predetermined voltage is applied to the corresponding drain side selection gate line SGD.

A drain of the source side selection transistor STS is connected to the other end of the memory cell transistors MT0 to MTn that are connected in series. A source of the source side selection transistor STS is connected to the source line SL. A control gate of the source side selection transistor STS is connected to the source side selection gate line SGS. The source side selection transistor STS connects the NAND string NS and the source line SL when a predetermined voltage is applied to the source side selection gate line SGS.

In the same block BLK, the control gates of the memory cell transistors MT0 to MTn are commonly connected to the corresponding word lines WL0 to WLn, respectively. The control gates of the drain side selection transistors STD in the string units SU0 to SU3 are commonly connected to the corresponding selection gate lines SGD0 to SGD3, respectively. The control gates of the source side selection transistors STS are commonly connected to the selection gate line SGS. In the memory cell array 11, the bit line BL is shared by the NAND strings NS to which the same column address is assigned in each string unit SU.

<2.2 Physical Configuration of Memory Cell Array>

Figure 3:
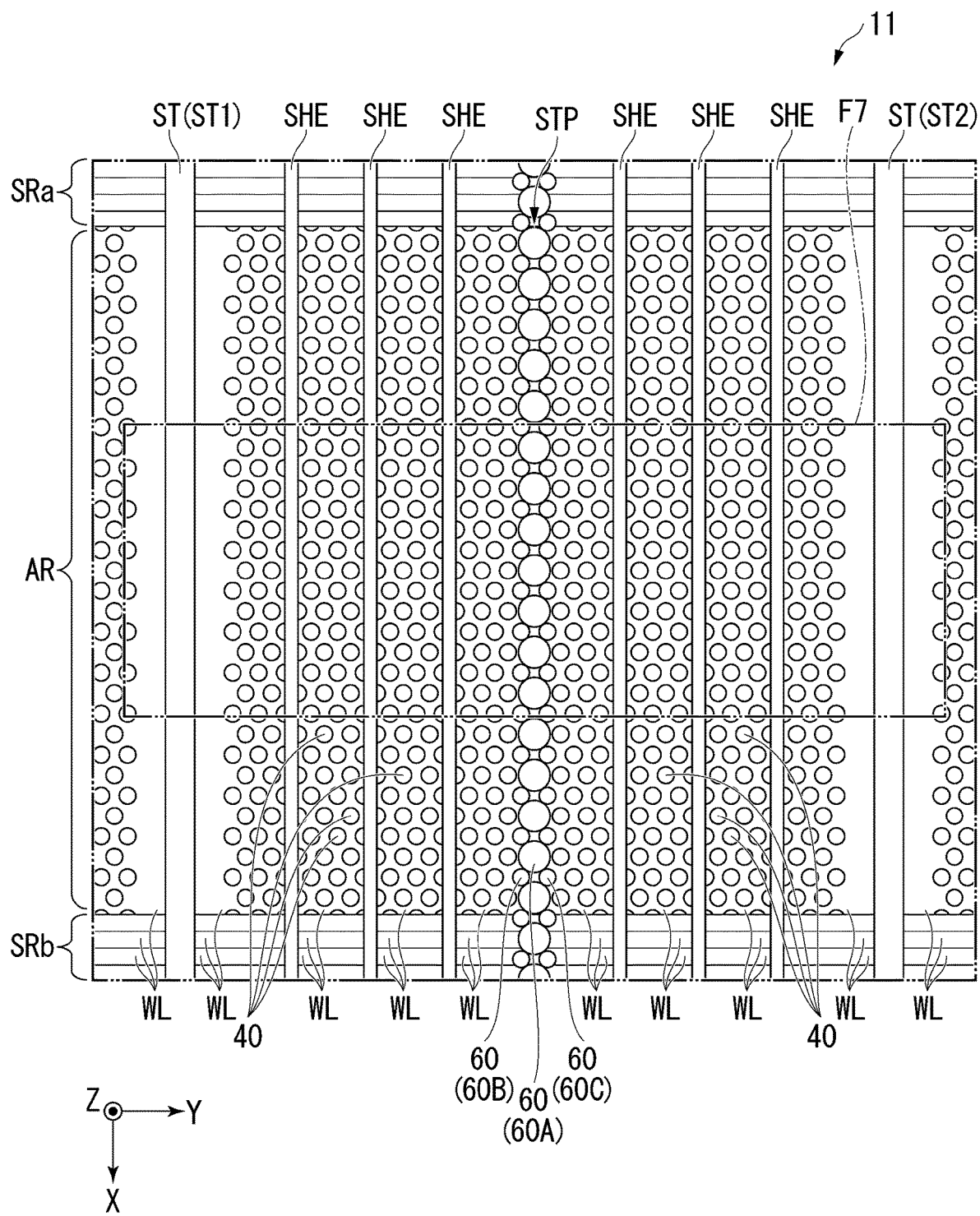
FIG. 3 is a cross-sectional view showing a part of the memory cell array according to the first embodiment when viewed from above.

FIG. 3 is a cross-sectional view showing a part of the memory cell array 11 when viewed from above. The memory cell array 11 includes an array region AR and a pair of staircase regions SRa and SRb.

The array region AR includes the plurality of the memory cell transistors MT (see FIG. 2). The array region AR is a region in which data can be stored. For example, the array region AR includes a multi-layered body 30 to be described later. A plurality of memory pillars 40 are provided in the multi-layered body 30. The plurality of the memory pillars 40 are disposed along a plurality of rows extending in the X direction. The array region AR will be described in detail later.

The pair of staircase regions SRa and SRb are disposed separately at both ends of the array region AR in the X direction. Each of the staircase regions SRa and SRb has a staircase structure. In the staircase structure, lengths in the X direction of a plurality of conductive layers 31 (for example, word lines WL) included in the multi-layered body 30 are different from each other. In the staircase regions SRa and SRb, a contact electrode (not shown) is connected to an end portion of each of the conductive layers 31 by utilizing the staircase structure described above. An upper interconnection (not shown) is connected to each contact electrode.

Figure 4:
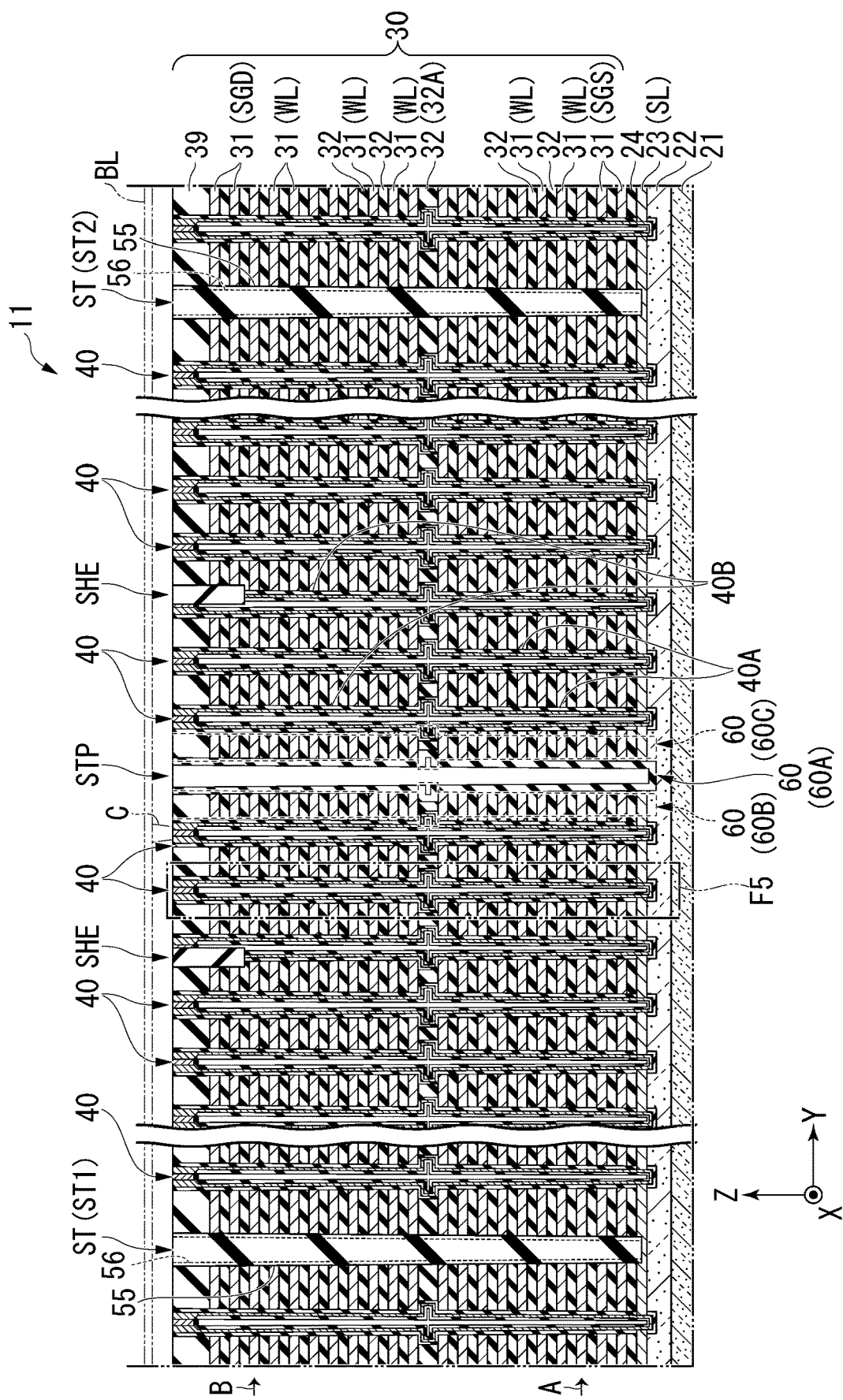
FIG. 4 is a cross-sectional view showing a part of the memory cell array according to the first embodiment.

FIG. 4 is a cross-sectional view showing a part of the memory cell array 11. As shown in FIG. 4, the memory cell array 11 includes, for example, a semiconductor substrate 21, a semiconductor layer 22, a conductive layer 23, an insulating layer 24, the multi-layered body 30, the plurality of the memory pillars 40, a plurality of contact electrodes C (only one is shown), a plurality of bit lines BL (only one is shown), a plurality of dividing parts ST, a plurality of dividing pillars 60 (only one is shown), and a plurality of upper dividing parts SHE.

<2.2.1 Lower Structure>

The semiconductor substrate 21 is, for example, a substrate serving as a base of the semiconductor storage device 1. At least a part of the semiconductor substrate 21 is formed in a plate shape in the X direction and the Y direction. The semiconductor substrate 21 is formed of, for example, a semiconductor material containing silicon. The semiconductor substrate 21 may not be present in the semiconductor storage device 1 as a final product by being removed after the multi-layered body 30 and the like to be described later are formed.

The semiconductor layer 22 is provided on the semiconductor substrate 21. The semiconductor layer 22 has a layer shape in the X direction and the Y direction. The semiconductor layer 22 is a stopper layer that prevent a hole H (see FIG. 12) from being etched too deeply. In the hole H, the memory pillar 40 is formed in a manufacturing process of the semiconductor storage device 1. The semiconductor layer 22 is formed of a semiconductor material such as polysilicon. The semiconductor storage device 1 may include an insulating layer functioning as a stopper layer instead of the semiconductor layer 22.

The conductive layer 23 is provided on the semiconductor layer 22. The conductive layer 23 has a layer shape in the X direction and the Y direction. The conductive layer 23 is formed of a conductive material such as tungsten. A lower end portion of the memory pillar 40 is connected to the conductive layer 23. The conductive layer 23 functions as a source line SL.

The insulating layer 24 is provided on the conductive layer 23. The insulating layer 24 has a layer shape in the X direction and the Y direction. The insulating layer 24 is formed of an insulating material such as silicon oxide.

<2.2.2 Multi-Layered Body>

Next, the multi-layered body 30 will be described. The multi-layered body 30 is provided on the insulating layer 24. The multi-layered body 30 includes, for example, the plurality of the conductive layers 31 and a plurality of insulating layers 32. The plurality of the conductive layers 31 and the plurality of the insulating layers 32 are alternately stacked one layer by one layer in the Z direction.

The conductive layer 31 is formed in a layer shape in the X direction and the Y direction. Each of the conductive layers 31 is formed of a conductive material such as, for example, tungsten. The conductive layer 31 is an example of a "gate electrode layer".

Of the plurality of the conductive layers 31, one or more (for example, a plurality of) conductive layers 31 farthest from the semiconductor substrate 21 function as the drain side selection gate line SGD. The drain side selection gate line SGD is commonly provided for the plurality of the memory pillars 40 aligned in the X direction or the Y direction. A portion at which the drain side selection gate line SGD and a channel layer 42 (to be described later) of each of the memory pillars 40 cross functions as the drain side selection transistor STD described above.

Of the plurality of the conductive layers 31, one or more (for example, a plurality of) conductive layers 31 closest to the semiconductor substrate 21 function as the source side selection gate line SGS. The source side selection gate line SGS is commonly provided for the plurality of the memory pillars 40 aligned in the X direction or the Y direction. A portion at which the source side selection gate line SGS and the channel layer 42 of each of the memory pillars 40 cross functions as the source side selection transistor STS described above.

Of the plurality of the conductive layers 31, the remaining conductive layers 31 sandwiched between the conductive layers 31 functions as the drain side selection gate line SGD or the source side selection gate line SGS. The remaining conductive layers 31 function as the word line WL. The word line WL is commonly provided for the plurality of the memory pillars 40 aligned in the X direction and the Y direction. In the embodiment, a portion at which the word line WL and the channel layer 42 of each of the memory pillars 40 cross functions as the memory cell transistor MT. The memory cell transistor MT will be described in detail later.

The insulating layer 32 is an interlayer insulating film provided between two conductive layers 31 adjacent to each other in the Z direction and insulating the two conductive layers 31. The insulating layer 32 is formed in a layer shape in the X direction and the Y direction. The insulating layer 32 is formed of an insulating material such as silicon oxide. Here, in the embodiment, each of the memory pillars 40 is a two-stage pillar including a lower pillar 40A and an upper pillar 40B. Of the plurality of the insulating layers 32, an insulating layer 32A positioned at the same height as a connecting part between the lower pillar 40A and the upper pillar 40B is thicker than the other insulating layers 32.

The multi-layered body 30 further includes an insulating layer 39. The insulating layer 39 is provided on the uppermost conductive layer 31. The insulating layer 39 is formed in a layer shape in the X direction and the Y direction. The insulating layer 39 is formed of an insulating material such as silicon oxide.

<2.2.3 Memory Pillar>

Next, the memory pillar 40 will be described.

Figure 5:
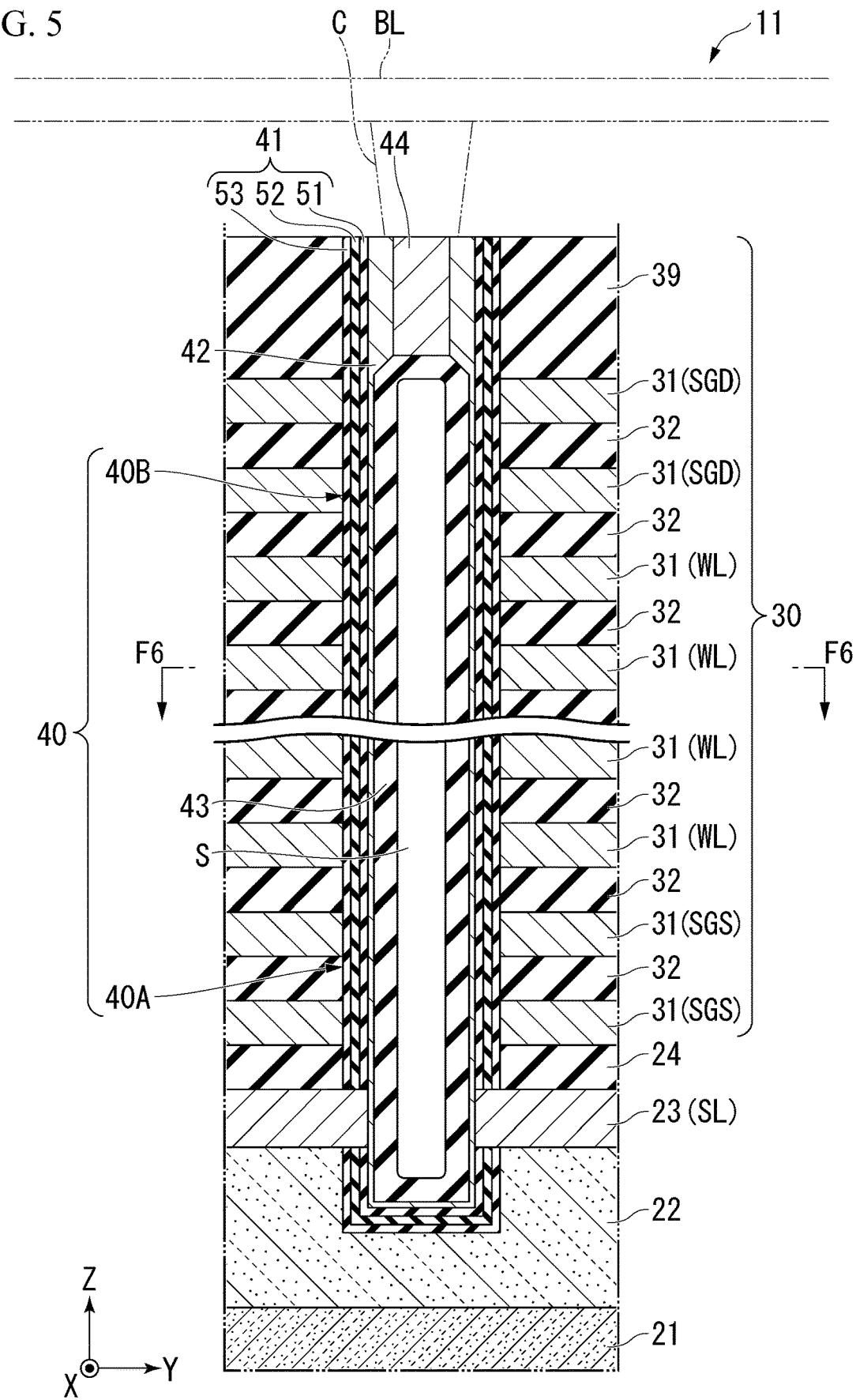
FIG. 5 is a cross-sectional view showing a region surrounded by line F5 in the memory cell array shown in FIG. 4.

FIG. 5 is a cross-sectional view showing a region surrounded by line F5 in the memory cell array 11 shown in FIG. 4. The memory pillar 40 has a columnar shape or an inverted truncated cone shape. The memory pillar 40 extends in the Z direction. The memory pillar 40 penetrates the multi-layered body 30, the insulating layer 24, and the conductive layer 23. A lower end portion of the memory pillar 40 enters the semiconductor layer 22. Each of the plurality of the memory pillars 40 disposed in a first region A1 (a region between a first dividing part ST1 and a third dividing part STP, see FIG. 7) to be described later is an example of a "second columnar body". Each of the plurality of the memory pillars 40 disposed in a second region A2 (a region between a second dividing part ST2 and the third dividing part STP, see FIG. 7) to be described later is an example of a "third columnar body".

Figure 6:
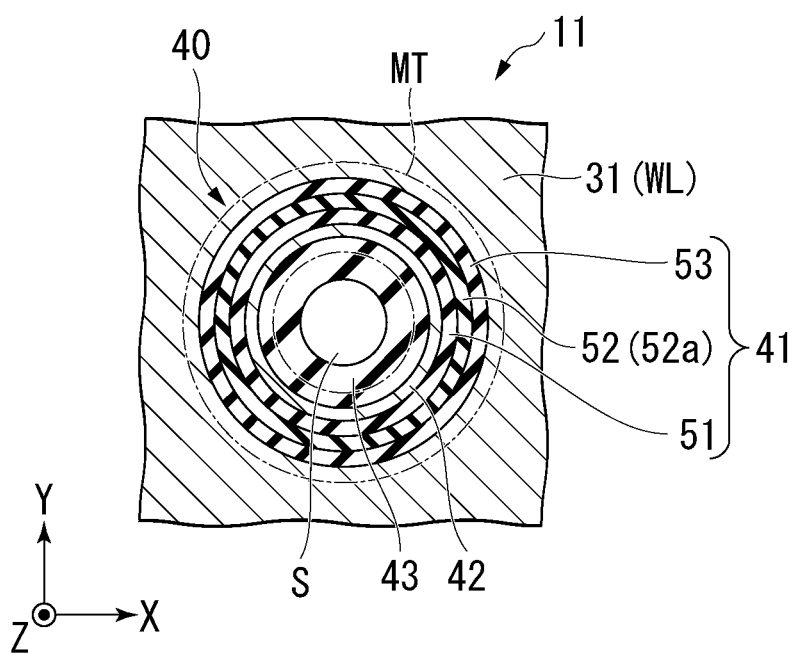
FIG. 6 is a cross-sectional view taken along line F6-F6 of the memory cell array shown in FIG. 5.

FIG. 6 is a cross-sectional view taken along line F6-F6 of the memory cell array 11 shown in FIG. 5. The memory pillar 40 includes, for example, a multilayer film 41, the channel layer 42, an insulating core 43, and a cap part 44 (see FIG. 5).

The multilayer film 41 is provided on an outer circumferential side of the channel layer 42. The multilayer film 41 is positioned between the plurality of the conductive layers 31 and the channel layer 42. The multilayer film 41 is an example of a "memory film". The multilayer film 41 includes, for example, a tunnel insulating film 51, a charge trap film 52, and a block insulating film 53.

The tunnel insulating film 51 is positioned between the channel layer 42 and the charge trap film 52. The tunnel insulating film 51 is formed in, for example, an annular shape along an outer circumferential surface of the channel layer 42. The tunnel insulating film 51 extends in the 7, direction parallel to the channel layer 42. The tunnel insulating film 51 extends over most of the memory pillar 40 in the Z direction. The tunnel insulating film 51 is a potential barrier between the channel layer 42 and the charge trap film 52. The tunnel insulating film 51 contains a silicon oxide, or a silicon oxide and a silicon nitride.

The charge trap film 52 is provided on an outer circumferential side of the tunnel insulating film 51. The charge trap film 52 is positioned between the tunnel insulating film 51 and the block insulating film 53. The charge trap film 52 extends over most of the memory pillar 40 in the Z direction. The charge trap film 52 has a large number of crystal defects (trapping levels). The charge trap film 52 is a functional film capable of trapping electric charges in those crystal defects. The charge trap film 52 is formed of, for example, silicon nitride. A portion 52a of the charge trap film 52 adjacent to each word line WL is an example of a "charge storage" that can store information by accumulating electric charge.

Therefore, at the same height as each word line WL, a metal-Al-nitride-oxide-silicon (MANOS) type memory cell transistor MT is formed by an end portion of the word line WL adjacent to the memory pillar 40, the block insulating film 53, the charge trap film 52, the tunnel insulating film 51, and the channel layer 42. Furthermore, the multilayer film 41 may include a floating gate type charge storage (floating gate electrode) as the charge storage instead of the charge trap film 52. The floating gate electrode is formed of, for example, polysilicon containing impurities.

The block insulating film 53 is provided on an outer circumferential side of the charge trap film 52. The block insulating film 53 is positioned between the plurality of the conductive layers 31 and the charge trap film 52. The block insulating film 53 is an insulating film that suppresses back tunneling. Back tunneling is a phenomenon in which electric charge returns from the word line WL to the charge trap film 52. The block insulating film 53 extends in the Z direction over most of the memory pillar 40 in the Z direction. The block insulating film 53 is a multi-layered structure film. In the multi-layered structure film, a plurality of insulating films such as, for example, a silicon oxide film or a metal oxide film are stacked. An example of the metal oxide is aluminum oxide. The block insulating film 53 may contain a high dielectric constant material (High-k material) such as silicon nitride or hafnium oxide.

The channel layer 42 is provided on an inner side of the multilayer film 41. The channel layer 42 is formed in an annular shape. The channel layer 42 extends over the entire length (entire height) of the memory pillar 40 in the Z direction. Here, a portion of the multilayer film 41 positioned at the same height as the source line SL is removed (see FIG. 5). Therefore, a lower end portion of the channel layer 42 is in contact with the source line SL to be connected to the source line SL. The channel layer 42 is formed of a semiconductor material such as polysilicon. The channel layer 42 may be doped with impurities. When a voltage is applied to the word line WL, the channel layer 42 forms a channel to electrically connect the bit line BL and the source line SL.

The insulating core 43 is provided on an inner side of the channel layer 42. The insulating core 43 fills a part of the inside of the channel layer 42. The insulating core 43 is formed of an insulating material such as silicon oxide. The insulating core 43 extends over most of the memory pillar 40 in the Z direction except for an upper end portion of the memory pillar 40. A part of the insulating core 43 may be formed in an annular shape along an inner circumferential surface of the channel layer 42, and may have a space (air gap) S therein.

The cap part 44 is provided above the insulating core 43 (see FIG. 5). The cap part 44 is a semiconductor part formed of a semiconductor material such as amorphous silicon. The cap part 44 may be doped with impurities. The cap part 44 is disposed inside the upper end portion of the channel layer 42. The cap part 44 forms an upper end portion of the memory pillar 40 together with the upper end portion of the channel layer 42. The contact electrode C is in contact with the cap part 44 in the Z direction.

<2.2.4 Upper Structure>

Each of the plurality of contact electrodes C is provided on the memory pillar 40. The contact electrode C extends in the Z direction and electrically connects the bit line BL and the channel layer 42 of the memory pillar 40. The contact electrode C is formed of a conductive material such as tungsten.

The bit line BL is disposed on one side (upper side) in the Z direction with respect to the multi-layered body 30. The bit line BL is provided on the contact electrode C. The bit line BL is connected to the channel layer 42 of the memory pillar 40 via the contact electrode C. Therefore, any memory cell transistor MT can be selected from a plurality of memory cell transistors MT disposed three-dimensionally by a combination of the word line WL and the bit line BL.

<2.2.5 Division Structure of Block>

Figure 7:
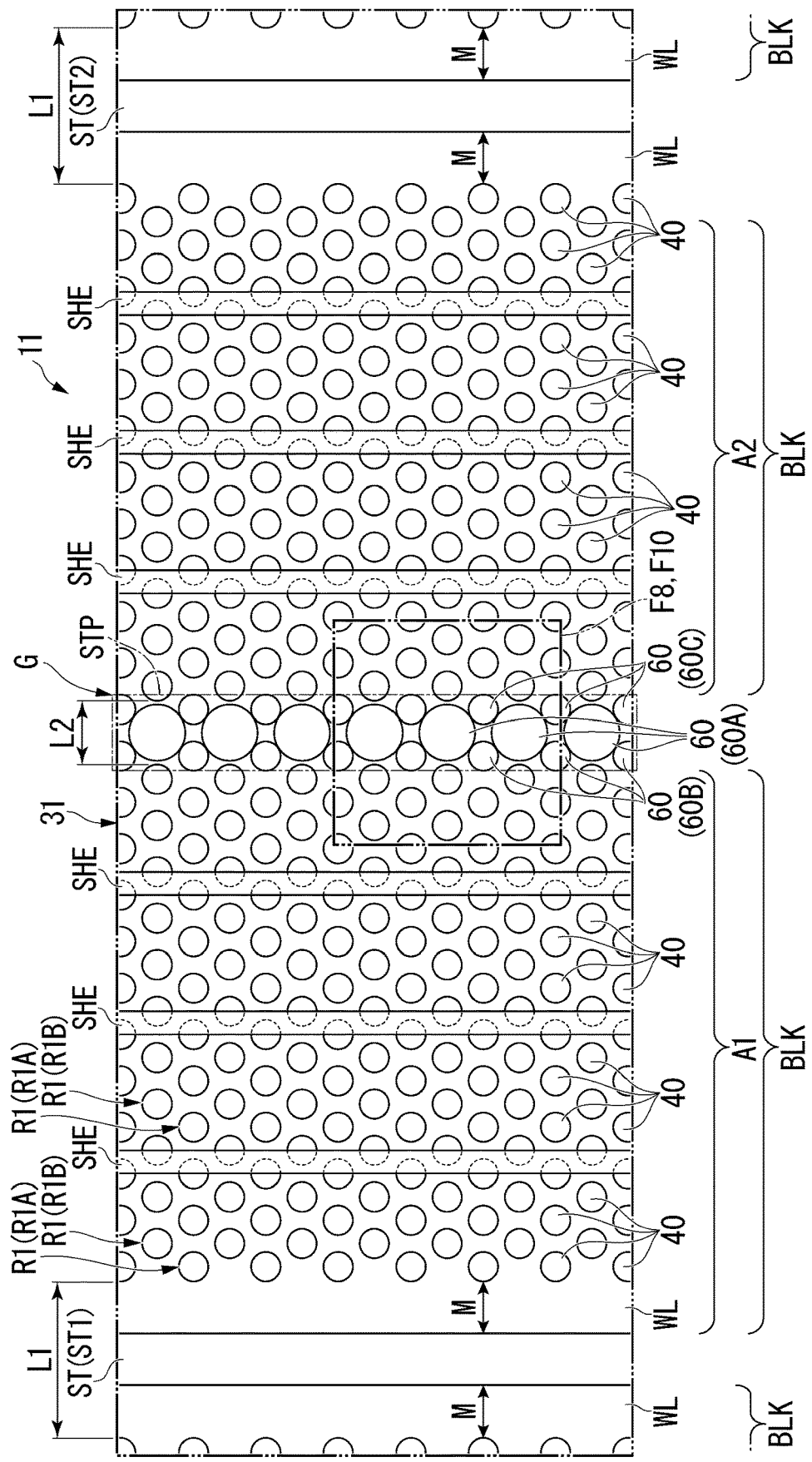
FIG. 7 is a cross-sectional view taken along line F7-F7 of the memory cell array shown in FIG. 3.

FIG. 7 is a cross-sectional view showing a region surrounded by the F7 line in the memory cell array 11 shown in FIG. 3. Here, a disposition of the plurality of the memory pillars 40 will be further described. The plurality of the memory pillars 40 are disposed apart from each other in the X direction or the Y direction. The plurality of the memory pillars 40 are disposed separately in, for example, a plurality of rows R1. The plurality of the rows R1 extend in the X direction at different positions in the Y direction. The plurality of the memory pillars 40 included in an odd-numbered row R1A from an end of the plurality of the rows R1 in the Y direction are disposed to be displaced in the X direction from the plurality of the memory pillars 40 included in an even-numbered row R1B from the end of the plurality of the rows R1 in the Y direction.

<Dividing Part>

The dividing part ST extends in the Z direction. The dividing part ST penetrates the multi-layered body 30 (see FIG. 4). The dividing part ST is a wall part that divides the multi-layered body 30 in the Y direction. The dividing part ST is provided in the X direction to extend across the pair of staircase regions SRa and SRb with the array region AR interposed therebetween. That is, the dividing part ST divides each of the plurality of the conductive layers 31 in the Y direction in each of the array region AR, the staircase region SRa, and the staircase region SRb. The dividing part ST includes, for example, an insulating part 55 and a conductive part 56 (FIG. 4).

The insulating part 55 forms most of the dividing part ST. The insulating part 55 extends in the Z direction. The insulating part 55 penetrates the multi-layered body 30 and the insulating layer 24. The insulating part 55 divides each of the plurality of the conductive layers 31 included in the multi-layered body 30 in the Y direction. The insulating part 55 is formed of an insulating material such as silicon oxide.

The conductive part 56 is provided inside the insulating part 55. The conductive part 56 extends in the Z direction. The conductive part 56 penetrates the multi-layered body 30 and the insulating layer 24. A lower end portion of the conductive part 56 is connected to the source line SL. The conductive part 56 is formed of a conductive material such as tungsten. The conductive part 56 is an interconnection that connects the source line SL and an interconnection in the memory cell array 11.

In the embodiment, the plurality of the dividing parts ST include the first dividing part ST1 and the second dividing part ST2. The second dividing part ST2 is separated from the first dividing part ST1 in the Y direction. The second dividing part ST2 is a dividing part ST adjacent to the first dividing part ST in the Y direction among the plurality of the dividing parts ST.

<Dividing Pillar>

The plurality of the dividing pillars 60 are disposed separately in a plurality of groups G (only one is shown in the drawings). The plurality of the dividing pillars 60 included in the same group G are disposed between two dividing parts ST in the Y direction. Therefore, the third dividing part STP including the plurality of the dividing pillars 60 included in the same group G is formed in the memory cell array 11.

The dividing part STP extends in the Z direction. The dividing part STP penetrates the multi-layered body 30 (see FIG. 4). Similarly to the dividing part ST, the dividing part STP is a wall part that divides the multi-layered body 30 in the Y direction. For example, the plurality of the dividing pillars 60 positioned between the first dividing part ST1 and the second dividing part ST2 divide each of the conductive layers 31 into the first region A1 and the second region A2. The first region A1 is a region positioned between the first dividing part ST1 and the plurality of the dividing pillars 60. The second region A2 is a region positioned between the second dividing part ST2 and the plurality of the dividing pillars 60 (see FIG. 7). The dividing part STP is provided in the X direction to extend across the pair of staircase regions SRa and SRb with the array region AR interposed therebetween. That is, the dividing part STP divides each of the plurality of the conductive layers 31 into the first region A1 and the second region A2 in each of the array region AR, the staircase region SRa, and the staircase region SRb (see FIG. 3). The dividing part STP is an example of the "third dividing part".

In the embodiment, a region divided by the dividing part ST and the dividing part STP corresponds to one block BLK. In the embodiment, the conductive layer 31 corresponding to the word line WL is divided in the Y direction by the dividing part ST and the dividing part STP. Therefore, the word line WL extending in the X direction is formed. Similarly, the conductive layer 31 corresponding to the source side selection gate line SGS is divided in the Y direction by the dividing part ST and the dividing part STP. Therefore, the source side selection gate line SGS extending in the X direction is formed. Furthermore, the dividing part STP will be described in detail later.

<Upper Dividing Part>

Each of the plurality of the upper dividing parts SHE extends in the X direction. The upper dividing part SHE is provided at an upper end portion of the multi-layered body 30. The upper dividing part SHE extends to a middle of the multi-layered body 30 in the Z direction (see FIG. 4). The upper dividing part SHE is a shallow dividing part compared to the dividing part ST or the dividing part STP. The upper dividing part SHE penetrates the conductive layer 31 functioning as the drain side selection gate line SGD. On the other hand, the upper dividing part SHE does not reach the conductive layer 31 functioning as the word line WL. The upper dividing part SHE is a wall part that divides the conductive layer 31 functioning as the drain side selection gate line SGD in the Y direction. The upper dividing part SHE is formed of an insulating material such as silicon oxide. In the embodiment, a region divided by the upper dividing part SHE corresponds to one string unit SU. The conductive layer 31 corresponding to the drain side selection gate line SGD is divided in the Y direction by the dividing part ST, the dividing part STP, and the upper dividing part SHE. Therefore, the drain side selection gate line SGD extending in the X direction is formed.

<2.2.6 Structure of Dividing Part Including Dividing Pillar>

Figure 8:
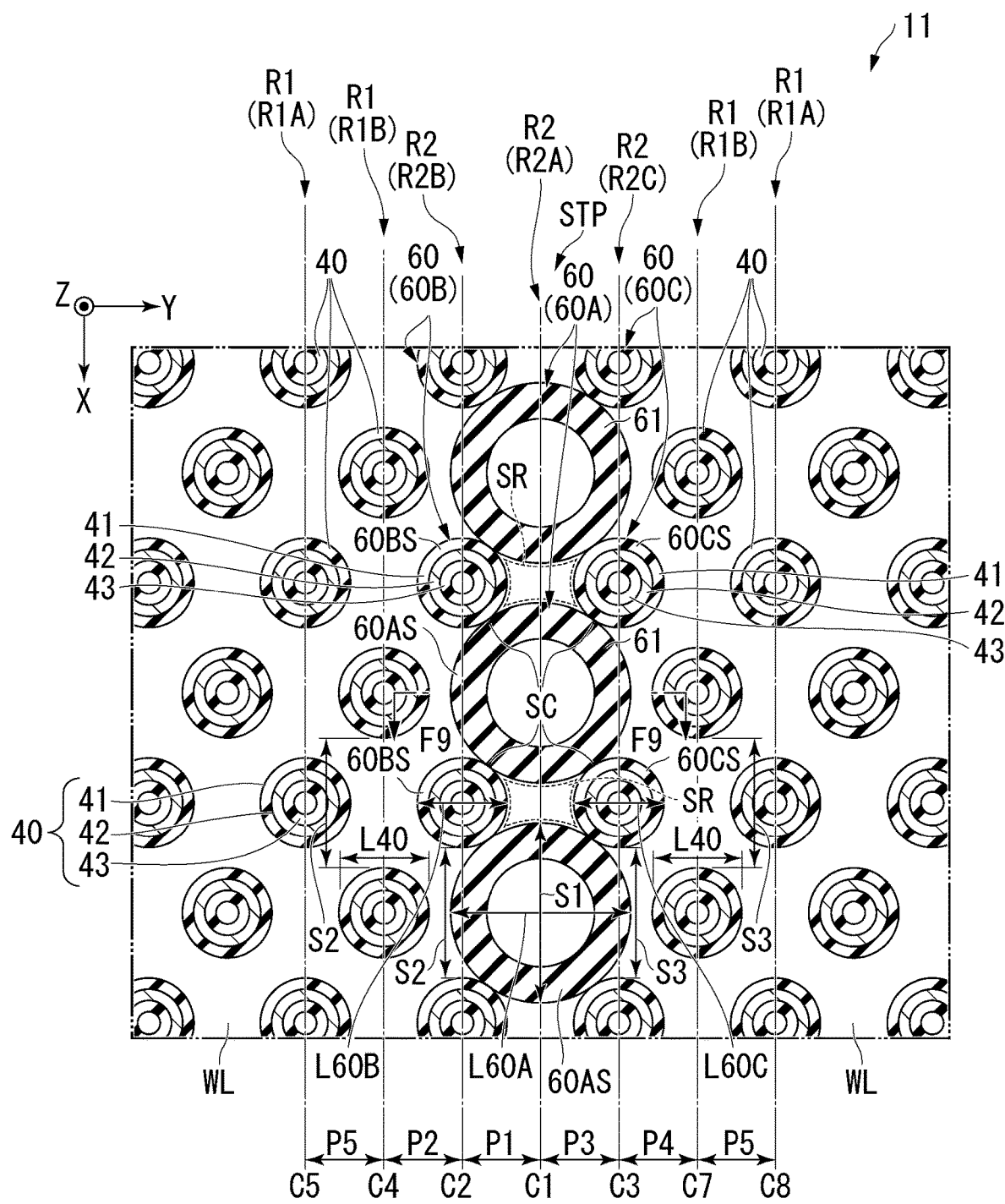
FIG. 8 is a cross-sectional view showing a region surrounded by line F8 in the memory cell array shown in FIG. 7.

FIG. 8 is a cross-sectional view showing a region surrounded by line F8 in the memory cell array 11 shown in FIG. 7. Furthermore, FIG. 8 is a cross-sectional view at a position corresponding to, for example, the word line WL in a lowermost layer (see arrow A in FIG. 4). That is, FIG. 8 is a cross-sectional view showing a portion in which the dividing pillar 60 is the thinnest.

The plurality of the dividing pillars 60 included in the dividing part STP are disposed separately in one or more rows R2 (for example, three rows R2) parallel to the X direction. In the embodiment, the plurality of the dividing pillars 60 include a plurality of first dividing pillars 60A disposed in a first row R2A, a plurality of second dividing pillars 60B disposed in a second row R2B, and a plurality of third dividing pillars 60C disposed in a third row R2C.

<First Dividing Pillar>

The first row R2A is positioned at a center in the Y direction between the plurality of the dividing parts ST (for example, the first dividing part ST1 and the second dividing part ST2). The first row R2A extends parallel to the X direction. The plurality of the first dividing pillars 60A are aligned in the X direction parallel to the first row R2A. The first dividing pillar 60A is an example of the "first columnar body".

The first dividing pillar 60A has insulating properties at least in an outer circumferential portion 60AS of the first dividing pillar 60A. In the embodiment, the first dividing pillar 60A has a hollow insulating part 61. The insulating part 61 is formed of an insulating material such as, for example, silicon oxynitride. The insulating part 61 includes an outer circumferential portion 60AS of the first dividing pillar 60A.

Figure 9:
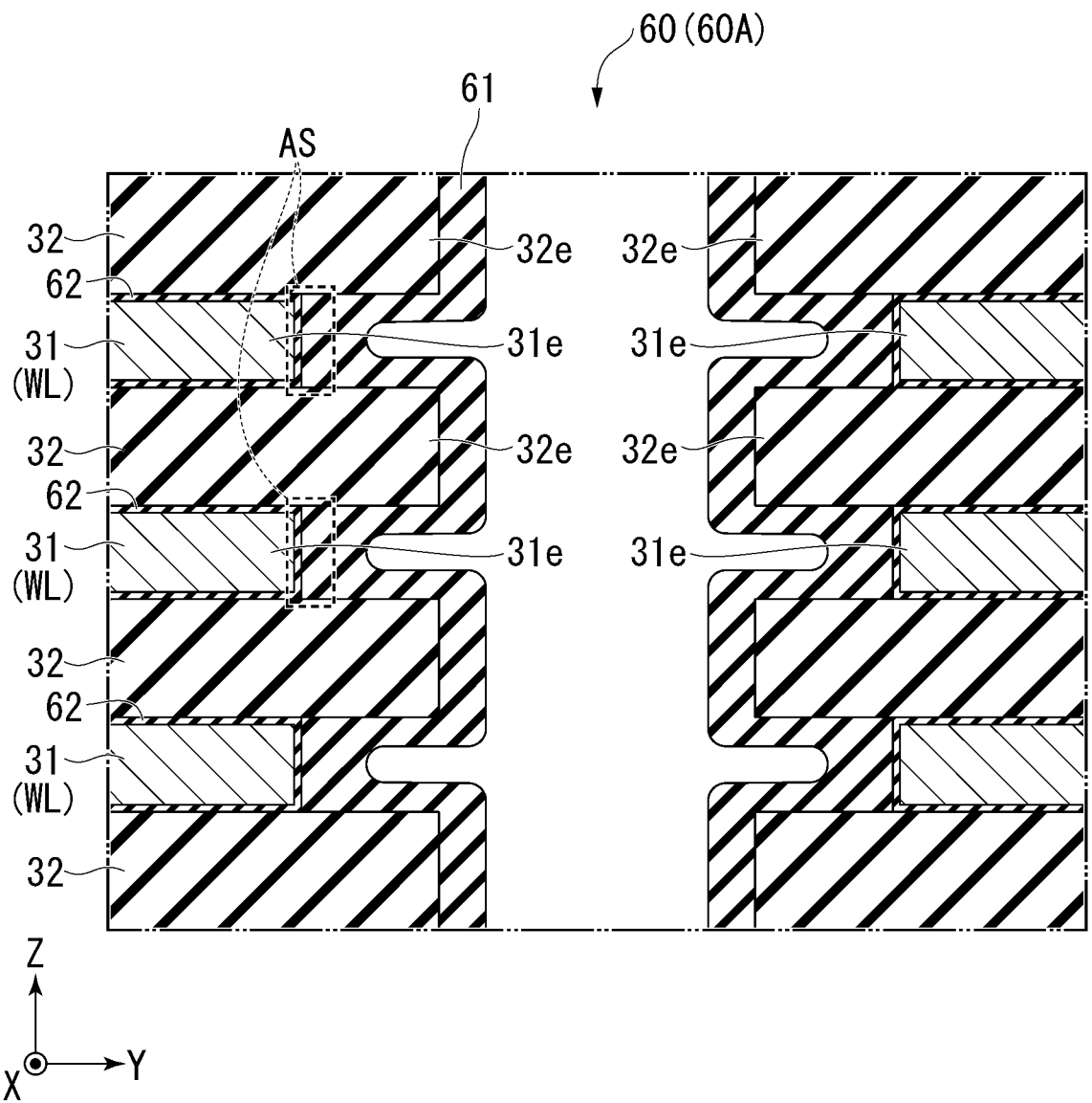
FIG. 9 is a cross-sectional view taken along line F9-F9 of the memory cell array shown in FIG. 8.

FIG. 9 is a cross-sectional view taken along line F9-F9 of the memory cell array 11 shown in FIG. 8. As shown in FIG. 8, the conductive layer 31 has an end portion 31e adjacent to the first dividing pillar 60A. The insulating layer 32 has an end portion 32e adjacent to the first dividing pillar 60A. In the embodiment, the end portion 31e of the conductive layer 31 is retreated in a direction away from the first dividing pillar 60A compared to the end portion 32e of the insulating layer 32. A part of the insulating part 61 of the first dividing pillar 60A enters between the plurality of the insulating layers 32 in the Z direction. The insulating part 61 of the first dividing pillar 60A covers the end portions 31e of the plurality of the conductive layers 31 and the end portions 32e of the plurality of the insulating layers 32.

Here, the memory cell array 11 may include an insulating film 62 as shown in FIG. 9. The insulating film 62 is provided along a boundary between the conductive layer 31 and the insulating layer 32 and a boundary between the conductive layer 31 and the insulating part 61 of the first dividing pillar 60A. For example, when a process in which a sacrificial layer 101 (see FIG. 11) in an intermediate multi-layered body 30M is replaced with the conductive layer 31 is included in a manufacturing process of the memory cell array 11, the insulating film 62 is an insulating film formed on an inner surface of a space from which the sacrificial layer 101 has been removed prior to the conductive layer 31 after the sacrificial layer 101 is removed. The insulating film 62 functions as a part of the block insulating film 53 of each of the memory pillars 40. The insulating film 62 is formed of, for example, a high-k film of an oxide film containing aluminum (Al), hafnium (Hf), and zirconium (Zr). Furthermore, the insulating film 62 may also be formed of silicon nitride.

In the embodiment, the insulating film 62 forms the insulating outer circumferential portion 60AS of the first dividing pillar 60A together with the insulating part 61 of the first dividing pillar 60A. In other words, the "outer circumferential portion 60AS of the first dividing pillar 60A" is not limited to an insulating part that is formed through a hole H2 (see FIG. 12) provided in the intermediate multi-layered body 30M to form the first dividing pillar 60A, and may include an insulating part formed by another process (for example, a process in which the sacrificial layer 101 is replaced with the conductive layer 31). The same definition applies to "an outer circumferential portion 60BS of the second dividing pillar 60B" and "an outer circumferential portion 60CS of the third dividing pillar 60C".

Furthermore, a configuration of the first dividing pillar 60A is not limited to the example described above. For example, the material forming the insulating part 61 is not limited to the above-described example, and may be silicon oxide or other insulating materials. The first dividing pillar 60A may be formed of an insulating part having no hollow portion therein. The first dividing pillar 60A may have the same MANOS structure as the memory pillar 40. An example in which the first dividing pillar 60A has a MANOS structure will be described later as a modified example.

<Second Dividing Pillar>

Returning to FIG. 8, the remaining configuration will be described.

The second row R2B is adjacent to the first row R2A in the Y direction. The second row R2B extends parallel to the X direction. The plurality of the second dividing pillars 60B are aligned in the X direction parallel to the second row R2B. In the embodiment, the plurality of the second dividing pillars 60B and the plurality of the first dividing pillars 60A are disposed to be displaced from each other in positions in the X direction so that they are alternately disposed one by one in the X direction. The second dividing pillar 60B is an example of a "fourth columnar body".

The second dividing pillar 60B has insulating properties at least in the outer circumferential portion 60BS of the second dividing pillar 60B. In the embodiment, the second dividing pillar 60B has the same MANOS structure as the memory pillar 40. That is, the second dividing pillar 60B includes the hollow insulating core 43, the channel layer 42, the tunnel insulating film 51, the charge trap film 52, and the block insulating film 53 in order from a central portion of the second dividing pillar 60B toward an outer circumferential side thereof. In the embodiment, the second dividing pillar 60B is a dummy pillar that does not function electrically. The block insulating film 53 of the second dividing pillar 60B includes the outer circumferential portion 60BS of the second dividing pillar 60B. In the embodiment, a diameter of the second dividing pillar 60B is the same as a diameter of the memory pillar 40. A dimension L60B (for example, a maximum dimension) of the second dividing pillar 60B in the Y direction is the same as a dimension L40 (for example, a maximum dimension) of the memory pillar 40 in the Y direction.

<Third Dividing Pillar>

The third row R2C is adjacent to the first row R2A from a side opposite to the second row R2B in the Y direction. The third row R2C extends parallel to the X direction. The plurality of the third dividing pillars 60C are aligned in the X direction parallel to the third row R2C. In the embodiment, the plurality of the third dividing pillars 60C and the plurality of the first dividing pillars 60A are disposed to be displaced from each other in the X direction so that they are alternately disposed one by one in the X direction. The plurality of the second dividing pillars 60B and the plurality of the third dividing pillars 60C are disposed at the same positions in the X direction. The third dividing pillar 60C is an example of a "fifth columnar body".

The third dividing pillar 60C has insulating properties at least in the outer circumferential portion 60CS of the third dividing pillar 60C. In the embodiment, the third dividing pillar 60C has the same MANOS structure as the memory pillar 40. That is, the third dividing pillar 60C includes the hollow insulating core 43, the channel layer 42, the tunnel insulating film 51, the charge trap film 52, and the block insulating film 53 in that order from a central portion of the third dividing pillar 60C toward an outer circumferential side thereof. In the embodiment, the third dividing pillar 60C is a dummy pillar that does not function electrically. The block insulating film 53 of the third dividing pillar 60C includes the outer circumferential portion 60CS of the third dividing pillar 60C. In the embodiment, a diameter of the third dividing pillar 60C is the same as the diameter of the memory pillar 40. A dimension L60C (for example, a maximum dimension) of the third dividing pillar 60C in the Y direction is the same as the dimension L40 (for example, the maximum dimension) of the memory pillar 40 in the Y direction.

<Narrow Structure of Dividing Pillar>

In the embodiment, the first dividing pillar 60A is formed to be thick so that a space between the first dividing pillar 60A and the second dividing pillar 60B is narrowed and a space between the first dividing pillar 60A and the third dividing pillar 60C is narrowed. For example, a diameter of the first dividing pillar 60A is larger than a diameter of the second dividing pillar 60B. A dimension L60A (for example, a maximum dimension) of the first dividing pillar 60A in the Y direction is larger than the dimension L60B (for example, the maximum dimension) of the second dividing pillar 60B in the Y direction. Similarly, a diameter of the first dividing pillar 60A is larger than a diameter of the third dividing pillar 60C. The dimension L60A (for example, the maximum dimension) of the first dividing pillar 60A in the Y direction is larger than the dimension L60C (for example, the maximum dimension) of the third dividing pillar 60C in the Y direction. From another viewpoint, a diameter of the first dividing pillar 60A is larger than a diameter of the memory pillar 40. The dimension L60A (for example, the maximum dimension) of the first dividing pillar 60A in the Y direction is larger than the dimension L40 (for example, the maximum dimension) of the memory pillar 40 in the Y direction. Furthermore, in the present application, "a diameter is large", "a width is large", or "a dimension is large" means that the diameter is large, the width is large, or the dimension is large at least at a position (height) corresponding to the conductive layer 31, and may also include that the diameter is not large or the dimension is not large at a position corresponding to the insulating layer 32.

In the embodiment, a width S1 of each of the plurality of the first dividing pillars 60A in the X direction is larger than a distance S2 between two second dividing pillars 60B adjacent in the X direction included in the plurality of the second dividing pillars 60B. That is, the distance S2 is a distance between two memory pillars 40 adjacent in the X direction included in the plurality of the memory pillars 40 disposed in the first region A1. Alternatively, the width S1 of each of the plurality of the first dividing pillars 60A in the X direction is larger than a distance S3 between two third dividing pillars 60C adjacent in the X direction included in the plurality of the third dividing pillars 60C. That is, the distance S3 is a distance between two memory pillars 40 adjacent in the X direction included in the plurality of the memory pillars 40 disposed in the second region A2. In the embodiment, the distance S2 and the distance S3 have the same size.

Therefore, the outer circumferential portion 60AS of each of the plurality of the first dividing pillars 60A is in contact with the outer circumferential portion 60BS of at least one second dividing pillar 60B adjacent to the first dividing pillar 60A. Therefore, a conductive layer dividing part SC is formed between the first dividing pillar 60A and the second dividing pillar 60B. In the conductive layer dividing part SC, the conductive layer 31 is not present. Furthermore, the first dividing pillar 60A is not limited to the case of being in contact with the outer circumferential portions 60BS of two adjacent second dividing pillars 60B, and may be in contact with only the outer circumferential portion 60BS of one adjacent second dividing pillar 60B.

From another viewpoint, in the embodiment, the outer circumferential portions 60BS of the plurality of the second dividing pillars 60B are each in contact with the outer circumferential portions 60AS of two first dividing pillars 60A included in the plurality of the first dividing pillars 60A. Furthermore, the second dividing pillar 60B is not limited to the case of being in contact with the outer circumferential portions 60AS of two first dividing pillars 60A, and may be in contact with only the outer circumferential portion 60AS of one first dividing pillar 60A.

In the embodiment, the outer circumferential portion 60AS of each of the plurality of the first dividing pillars 60A is in contact with the outer circumferential portions 60BS of two second dividing pillars 60B adjacent to the first dividing pillar 60A. Therefore, the conductive layer dividing part SC is formed between the first dividing pillar 60A and each of the two second dividing pillars 60B.

Similarly, the outer circumferential portion 60AS of each of the plurality of the first dividing pillars 60A is in contact with the outer circumferential portions 60CS of at least one third dividing pillar 60C adjacent to the first dividing pillar 60A. Therefore, the conductive layer dividing part SC is formed between the first dividing pillar 60A and the third dividing pillar 60C. In the conductive layer dividing part SC, the conductive layer 31 is not present. Furthermore, the first dividing pillar 60A is not limited to the case of being in contact with the outer circumferential portions 60CS of two adjacent third dividing pillars 60C, and may be in contact with only the outer circumferential portion 60CS of one adjacent third dividing pillar 60C.

From another viewpoint, in the embodiment, the outer circumferential portions 60CS of the plurality of the third dividing pillars 60C are each in contact with the outer circumferential portions 60AS of two first dividing pillars 60A included in the plurality of the first dividing pillars 60A. Furthermore, the third dividing pillar 60C is not limited to the case of being in contact with the outer circumferential portions 60AS of two first dividing pillars 60A, and may be in contact with only the outer circumferential portion 60AS of one first dividing pillar 60A.

In the embodiment, the outer circumferential portion 60AS of each of the plurality of the first dividing pillars 60A is in contact with the outer circumferential portions 60CS of two third dividing pillars 60C adjacent to the first dividing pillar 60A. Therefore, the conductive layer dividing part SC is formed between the first dividing pillar 60A and each of the two third dividing pillars 60C. In the conductive layer dividing part SC, the conductive layer 31 is not present.

In the embodiment, a region SR is surrounded by four conductive layer dividing parts SC between two first dividing pillars 60A adjacent to each other in the X direction, the second dividing pillar 60B, and the third dividing pillar 60C. Particularly, when a process in which the sacrificial layer 101 (see FIG. 12) in the intermediate multi-layered body 30M is replaced with the conductive layer 31 is included in the manufacturing process of the memory cell array 11, the sacrificial layer 101 remains in the region SR in a final product without being replaced by the conductive layer 31 due to the presence of the conductive layer dividing parts SC. The sacrificial layer 101 is, for example, a silicon nitride. The sacrificial layer 101 has insulating properties. Therefore, the region SR functions as a large insulating part corresponding to a distance between the second dividing pillar 60B and the third dividing pillar 60C.

Furthermore, a configuration of the dividing pillar 60 is not limited to the example described above. For example, the outer circumferential portion 60AS of the first dividing pillar 60A may be in contact with the outer circumferential portion 60AS of the first dividing pillar 60A adjacent to each other in the X direction in place of being in contact with the outer circumferential portion 60BS of the second dividing pillar 60B and the outer circumferential portion 60CS of the third dividing pillar 60C. Alternatively, the outer circumferential portion 60AS of the first dividing pillar 60A may be in contact with the outer circumferential portion 60AS of the first dividing pillar 60A adjacent to each other in the X direction in addition to being in contact with the outer circumferential portion 60BS of the second dividing pillar 60B and the outer circumferential portion 60CS of the third dividing pillar 60C.

In the embodiment, a distance P1 between a center line C1 passing through centers of the plurality of the first dividing pillars 60A and a center line C2 passing through centers of the plurality of the second dividing pillars 60B is the same as a distance P2 between the center line C2 passing through the centers of the plurality of the second dividing pillars 60B and a center line C4 passing through centers of the plurality of the memory pillars 40. Furthermore, the distance P1 is the same as a distance P5 between the center line C4 passing through the centers of the plurality of the memory pillars 40 disposed in the row R1B and a center line C5 passing through centers of the plurality of the memory pillars 40 disposed in the row R1A. Similarly, a distance P3 between the center line C1 passing through the centers of the plurality of the first dividing pillars 60A and a center line C3 passing through centers of the plurality of the third dividing pillars 60C is the same as a distance P4 between the center line C3 passing through the centers of the plurality of the third dividing pillars 60C and a center line C7 passing through centers of the plurality of the memory pillars 40. Furthermore, the distance P3 is the same as a distance P5 between the center line C7 passing through the centers of the plurality of the memory pillars 40 disposed in the row R1B and a center line C8 passing through centers of the plurality of the memory pillars 40 disposed in the row R1A.

Figure 10:
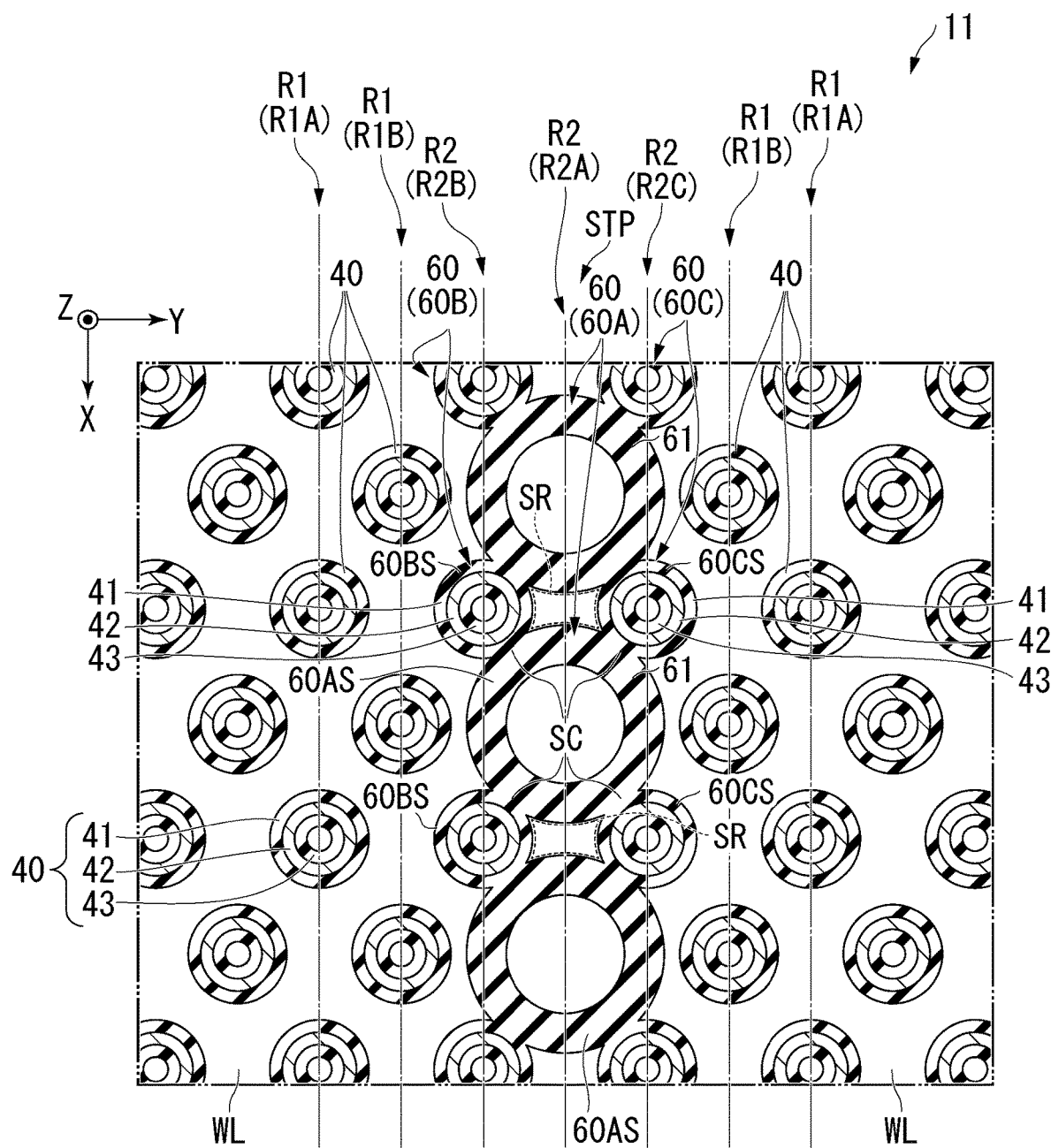
FIG. 10 is a cross-sectional view showing a region surrounded by line F10 in the memory cell array shown in FIG. 7.

FIG. 10 is a cross-sectional view showing a region surrounded by line F10 in the memory cell array 11 shown in FIG. 7. Furthermore, FIG. 10 is a cross-sectional view at a position corresponding to, for example, the word line WL on an uppermost layer (see arrow B in FIG. 4). That is, FIG. 10 is a cross-sectional view in a portion in which the dividing pillar 60 is the thickest. In the embodiment, the structure described with reference to FIG. 8 is realized from an upper end portion to a lower end portion of the dividing pillar 60.

3. Manufacturing Method

<3.1 First Example of Manufacturing Method>

Next, an example of a method of manufacturing the semiconductor storage device 1 will be described.

Figure 11:
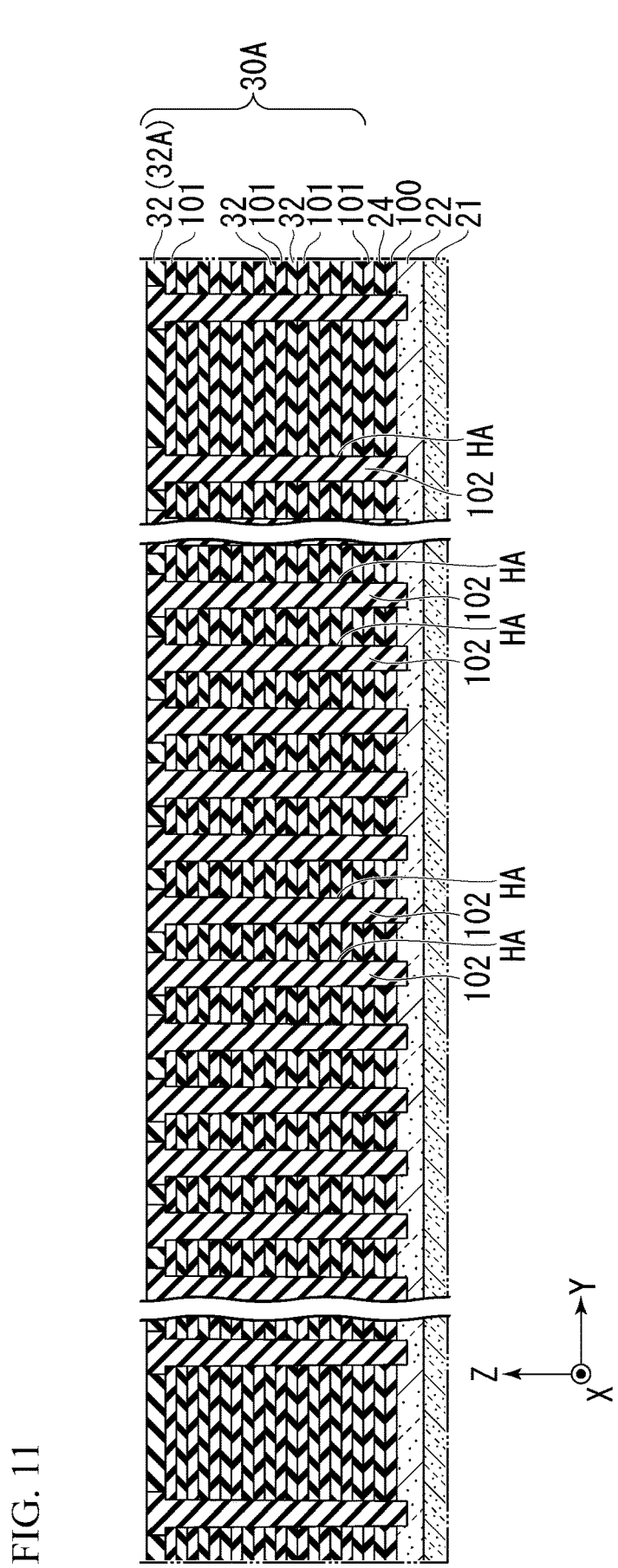
FIG. 11 is a cross-sectional view for explaining a first example of a manufacturing method according to the first embodiment.

FIGS. 11 to 17 are cross-sectional views for explaining a first example of the method of manufacturing the semiconductor storage device 1. First, as shown in FIG. 11, the semiconductor layer 22, a sacrificial layer 100, and the insulating layer 24 are stacked on the semiconductor substrate 21. The sacrificial layer 100 is formed of an insulating material such as, for example, silicon nitride. The sacrificial layer 100 is an insulating layer that is replaced with the conductive layer 23 in a subsequent process.

Next, the sacrificial layer 101 and the insulating layer 32 are alternately stacked on the insulating layer 24. The sacrificial layer 101 is an example of a "first layer". The insulating layer 32 is an example of a "second layer". The sacrificial layer 101 is formed of an insulating material such as silicon nitride. The sacrificial layer 101 is an insulating layer that is replaced with the conductive layer 31 in a subsequent process. Therefore, a first intermediate multi-layered body 30MA is formed.

Next, a hole HA is provided with respect to the first intermediate multi-layered body 30MA. The hole HA extends in the Z direction. The hole HA is opened at a position corresponding to all of the memory pillar 40, the first dividing pillar 60A, the second dividing pillar 60B, and the third dividing pillar 60C. Next, the inside of the hole HA is filled with a sacrificial body 102. The sacrificial body 102 is formed of a semiconductor material such as, for example, polysilicon.

Figure 12:
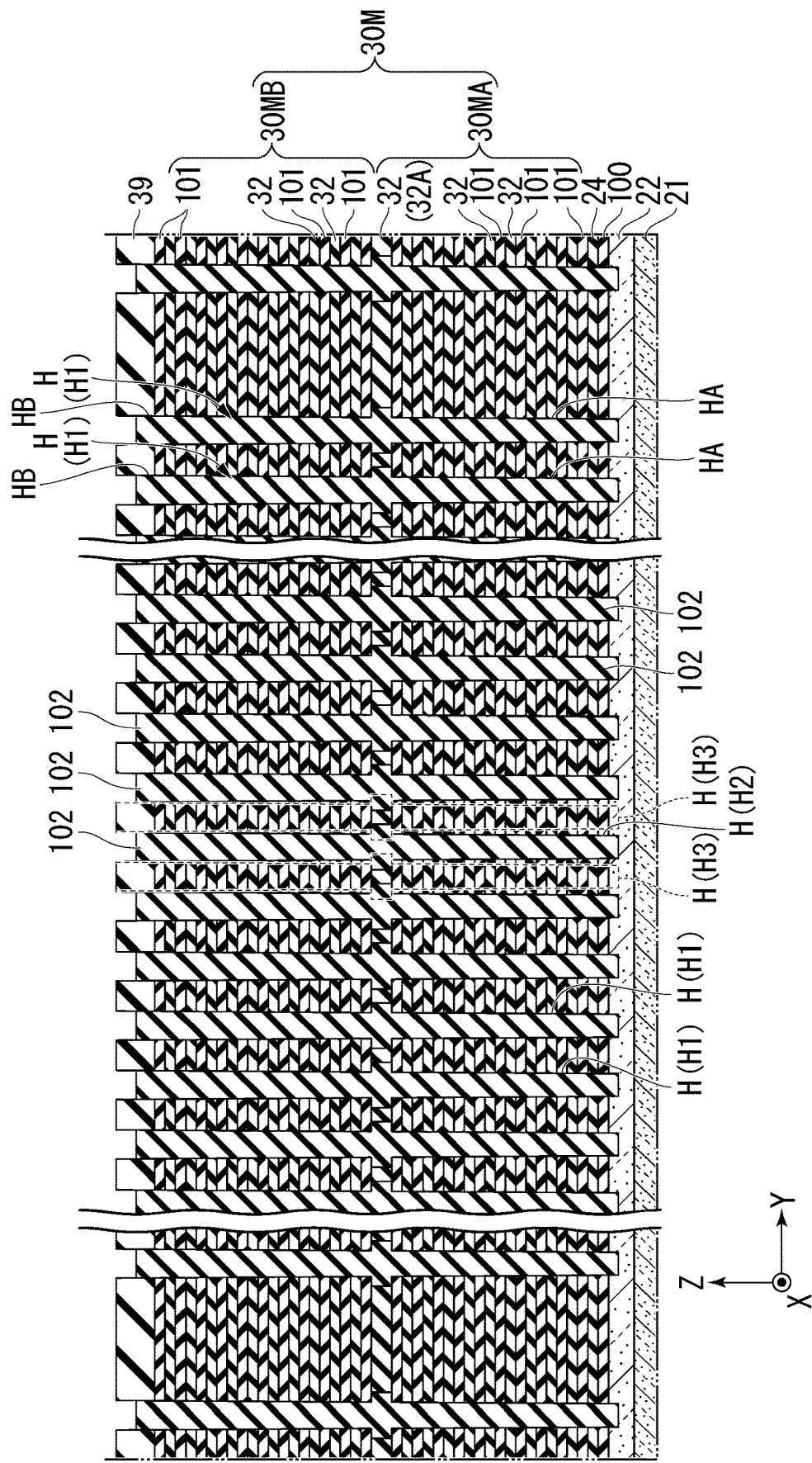
FIG. 12 is a cross-sectional view for explaining the first example of the manufacturing method according to the first embodiment.

Next, as shown in FIG. 12, the sacrificial layer 101 and the insulating layer 32 are alternately stacked on the first intermediate multi-layered body 30MA. Therefore, a second intermediate multi-layered body 30MB is formed. Next, a hole HB is provided with respect to the second intermediate multi-layered body 30MB. The hole HB is provided at the same position as the hole HA when viewed in the Z direction. Next, the inside of the hole HB is filled with the sacrificial body 102. Hereinafter, the hole HA and the hole HB are collectively referred to as the hole H. A plurality of holes H include a plurality of first holes H1 in which the memory pillar 40 is formed, a plurality of second holes H2 in which the first dividing pillar 60A is formed, and a plurality of third holes H3 in which the second dividing pillar 60B or the third dividing pillar 60C is formed. Also, in the following, the first intermediate multi-layered body 30MA, the insulating layer 32, and the second intermediate multi-layered body 30MB are collectively referred to as the intermediate multi-layered body 30M.

Figure 13:
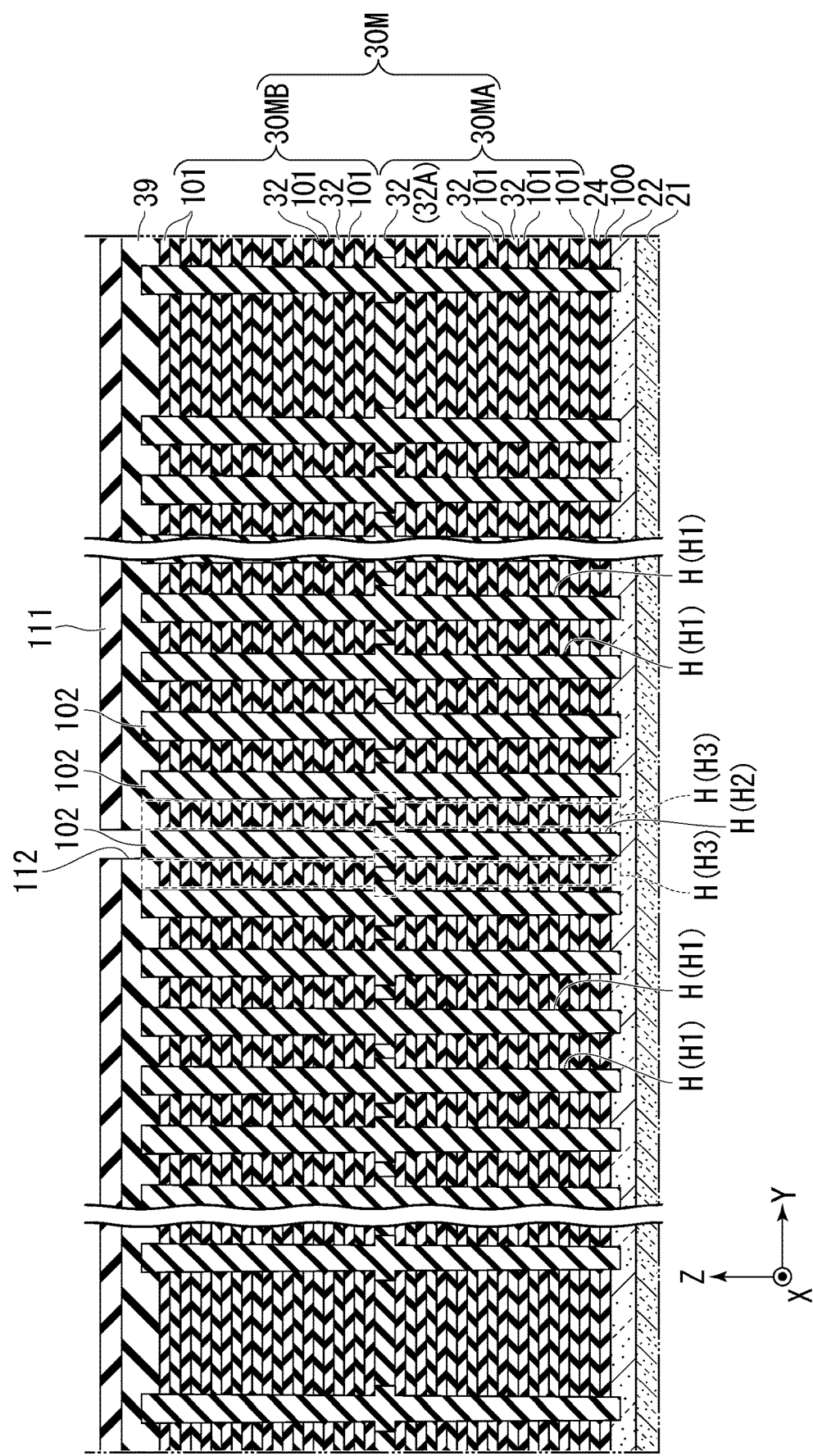
FIG. 13 is a cross-sectional view for explaining the first example of the manufacturing method according to the first embodiment.

Next, as shown in FIG. 13, an insulating layer 111 is provided on the intermediate multi-layered body 30M. Next, in the insulating layer 111, an opening 112 is formed only at a position corresponding to the first dividing pillar 60A.

Figure 14:
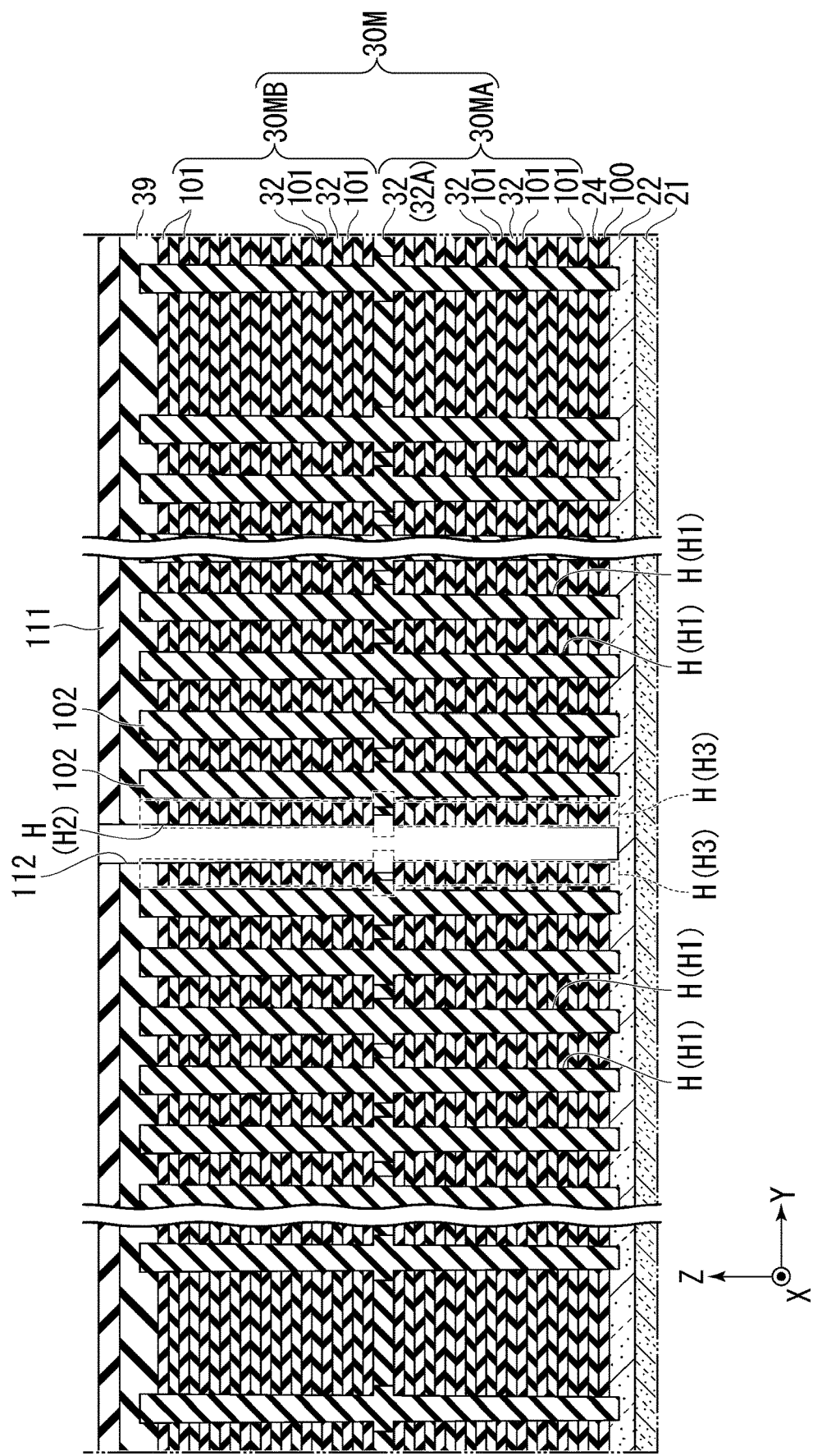
FIG. 14 is a cross-sectional view for explaining the first example of the manufacturing method according to the first embodiment.

Next, as shown in FIG. 14, reactive ion etching (RIE) is performed through the opening 112 to remove the sacrificial body 102 from the hole H2 corresponding to the first dividing pillar 60A (hereinafter, simply referred to as "hole H2"). Next, an end portion of the sacrificial layer 101 of the intermediate multi-layered body 30M exposed in the hole H2 is removed by wet etching through the hole H2. Therefore, at positions corresponding to at least a plurality of sacrificial layers 101, an inner diameter of the hole H2 is expanded so that the inner diameter of the hole H2 is larger than an inner diameter of the hole H1, and the inner diameter of the hole H2 is larger than an inner diameter of the hole H3. Furthermore, as described above, the expansion of the hole H2 need only be performed at least at a position corresponding to the sacrificial layer 101, and may not be performed at a position corresponding to the insulating layer 32.

Figure 15:
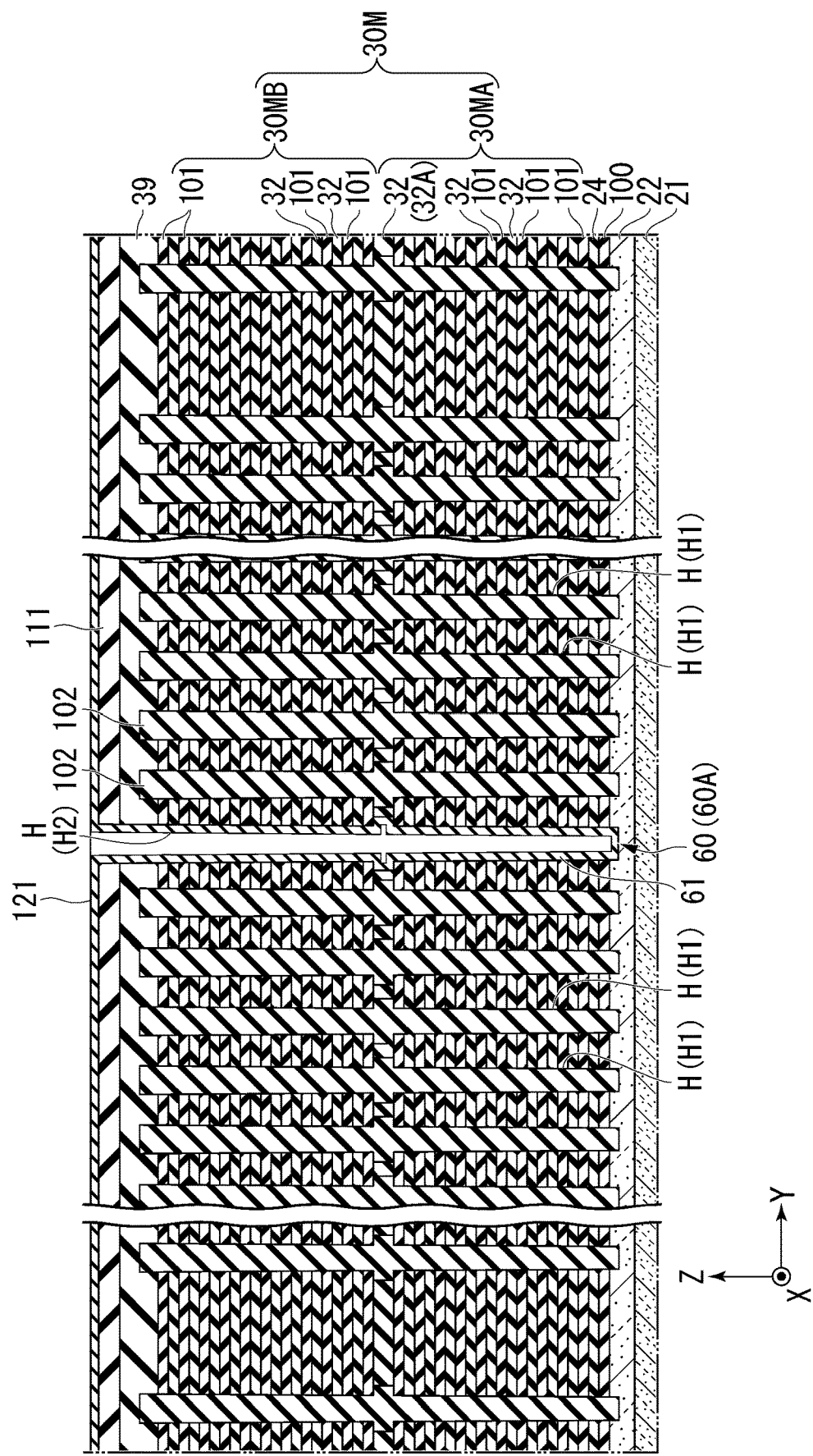
FIG. 15 is a cross-sectional view for explaining the first example of the manufacturing method according to the first embodiment.

Next, as shown in FIG. 15, an insulating film 121 formed of, for example, silicon nitride is formed on an inner surface of the second hole H2. Next, an oxidizing agent is supplied through the second hole H2 to oxidize the insulating film 121. In this process, an end portion of the sacrificial layer 101 adjacent to the insulating film 121 is oxidized at the same time. Therefore, the first dividing pillar 60A having the insulating part 61 is formed inside the second hole H2.

Figure 16A:
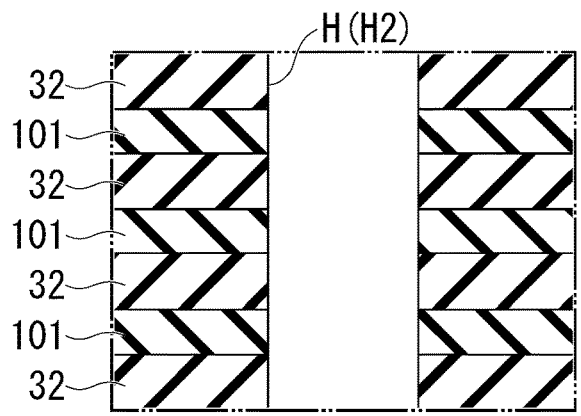
FIG. 16A is a cross-sectional view for explaining the first example of the manufacturing method according to the first embodiment.
Figure 16B:
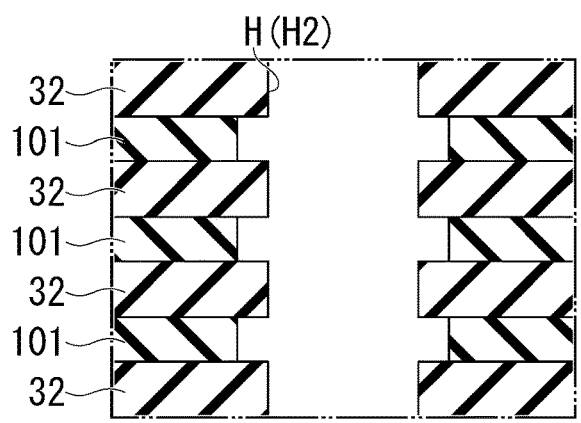
FIG. 16B is a cross-sectional view for explaining the first example of the manufacturing method according to the first embodiment.
Figure 16C:
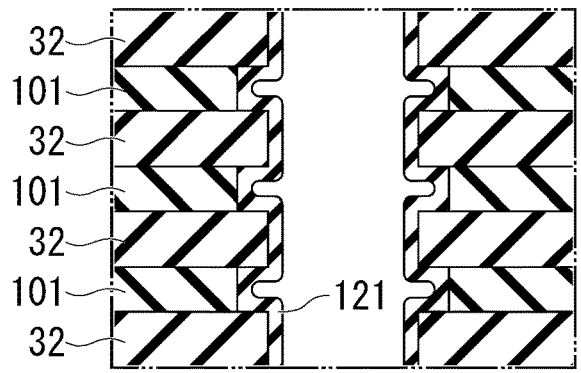
FIG. 16C is a cross-sectional view for explaining the first example of the manufacturing method according to the first embodiment.
Figure 16D:
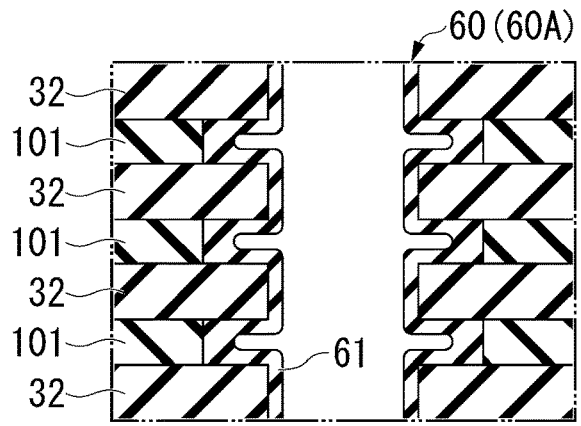
FIG. 16D is a cross-sectional view for explaining the first example of the manufacturing method according to the first embodiment.

FIGS. 16A to 16D are cross-sectional views for explaining a process of forming the insulating part 61 in detail. FIG. 16A corresponds to the process shown in FIG. 13, and shows a state in which the second hole H2 is formed. FIG. 16B corresponds to the process shown in FIG. 14, and shows a state in which the end portion of the sacrificial layer 101 exposed to the hole H2 is removed by wet etching. FIG. 16C corresponds to the process shown in FIG. 15, and shows a state in which the insulating film 121 is formed on the inner surface of the second hole H2. FIG. 16D corresponds similarly to the process shown in FIG. 15, and shows a state in which an oxidizing agent is supplied through the second hole H2, and the insulating film 121 and an end portion of the sacrificial layer 101 adjacent to the insulating film 121 are oxidized at the same time. The end portion of the sacrificial layer 101 is oxidized by the oxidizing agent supplied through the second hole H2 and becomes a part of the insulating part 61. Therefore, a film thickness of the insulating part 61 increases.

Figure 17:
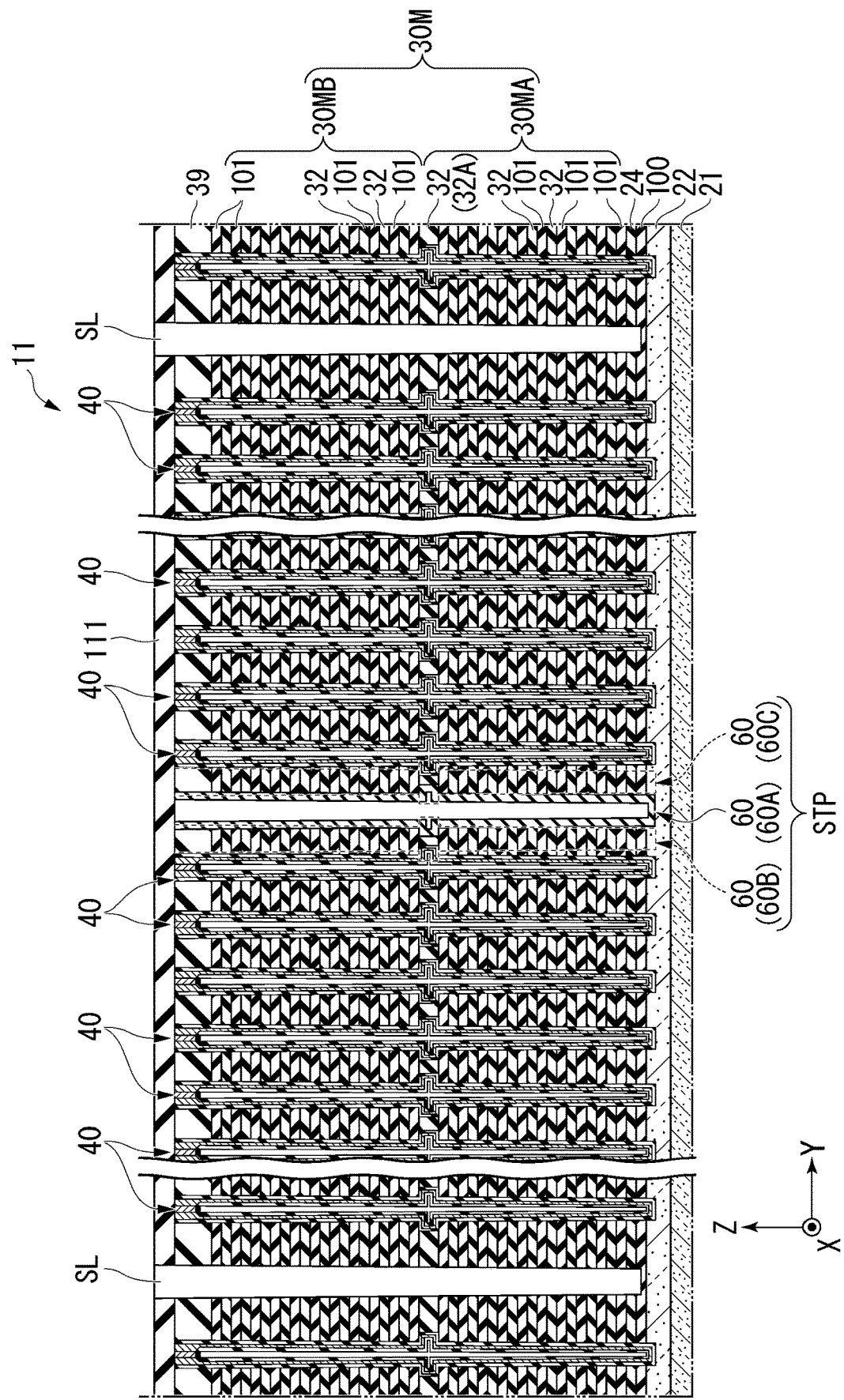
FIG. 17 is a cross-sectional view for explaining the first example of the manufacturing method according to the first embodiment.
Figure 18:
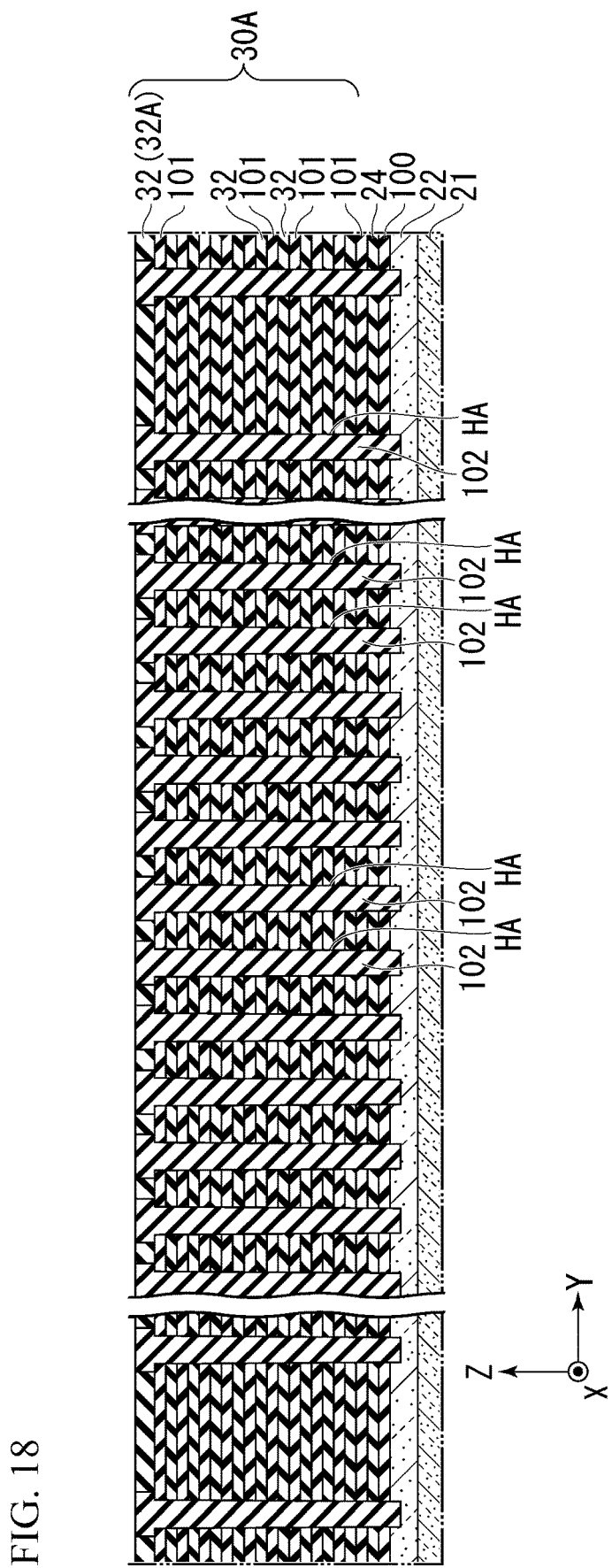
FIG. 18 is a cross-sectional view for explaining a second example of the manufacturing method according to the first embodiment.

Next, as shown in FIG. 17, the sacrificial bodies 102 of the first hole H1 and the third hole H3 corresponding to the memory pillar 40, the second dividing pillar 60B, and the third dividing pillar 60C are removed, and materials of the block insulating film 53, the charge trap film 52, the tunnel insulating film 51, the channel layer 42, and the insulating core 43 are sequentially supplied to the insides of the first hole H1 and the third hole H3 to form a MANOS structure. Therefore, the memory pillar 40, the second dividing pillar 60B, and the third dividing pillar 60C are formed at the same time.

Next, a slit SL is provided at a position corresponding to the dividing part ST. Then, the sacrificial layer 101 is removed by wet etching through the slit SL, and a conductive material such as tungsten is supplied to a space in which the sacrificial layer 101 has been present. Therefore, the sacrificial layer 101 is replaced with the conductive layer 31. Also, the sacrificial layer 100 is removed by wet etching through the slit SL, and a conductive material such as tungsten is supplied to a space in which the sacrificial layer 100 has been present. Therefore, the sacrificial layer 100 is replaced with the conductive layer 23. The other manufacture of the semiconductor storage device 1 can be performed by a known method.

<3.2 Second Example of Manufacturing Method>

Next, another example of the method of manufacturing the semiconductor storage device 1 will be described.

FIGS. 18 to 26 are cross-sectional views for explaining a second example of the method of manufacturing the semiconductor storage device 1. The processes up to FIG. 17 are the same as those in the first example described above.

Figure 19:
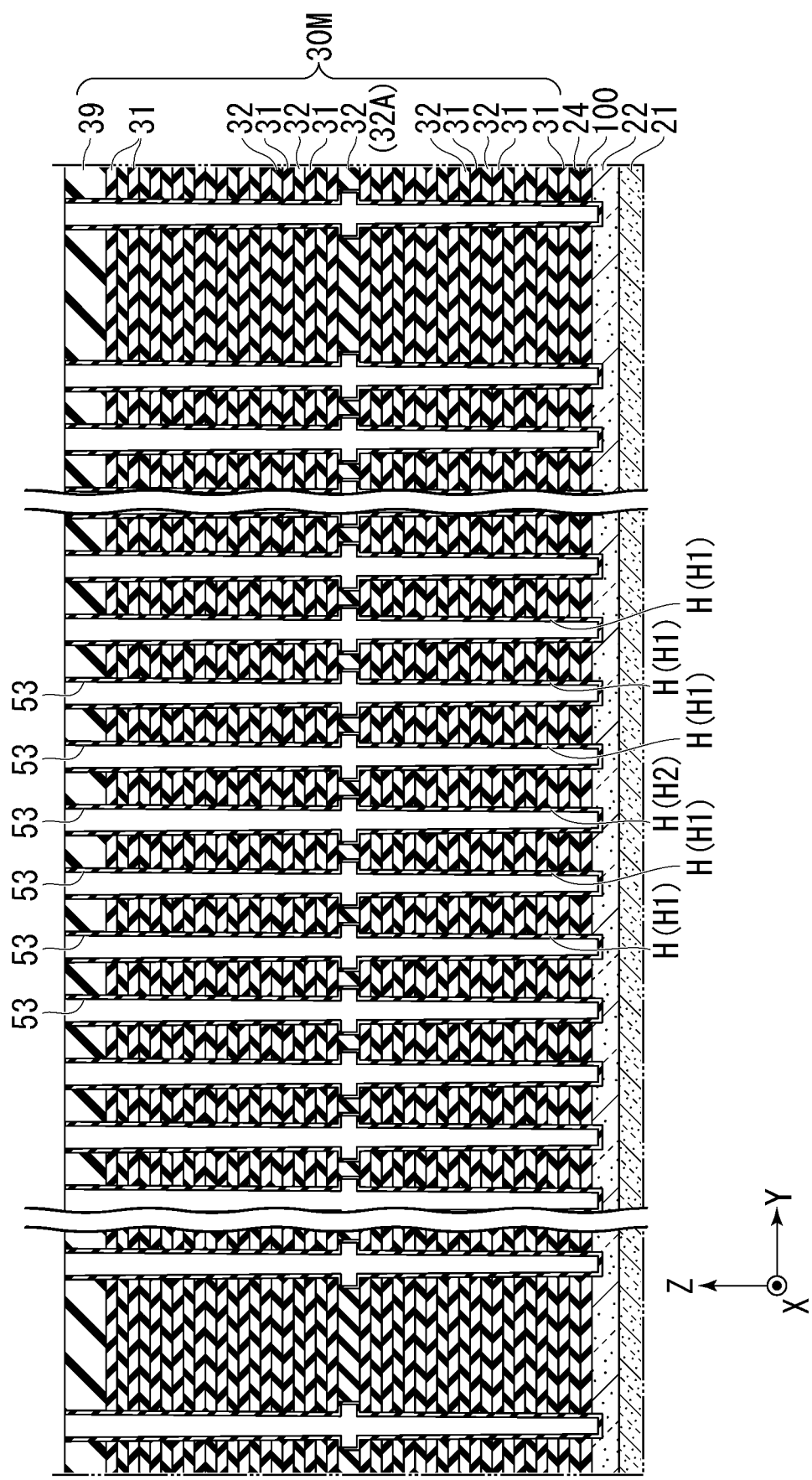
FIG. 19 is a cross-sectional view for explaining the second example of the manufacturing method according to the first embodiment.

Next, the sacrificial bodies 102 of all the holes H are removed as shown in FIG. 19. Next, as shown in FIG. 19, a material of the block insulating film 53 is supplied to inner surfaces of all the holes H to form the block insulating films 53 on the inner surfaces of all the holes H.

Figure 20:
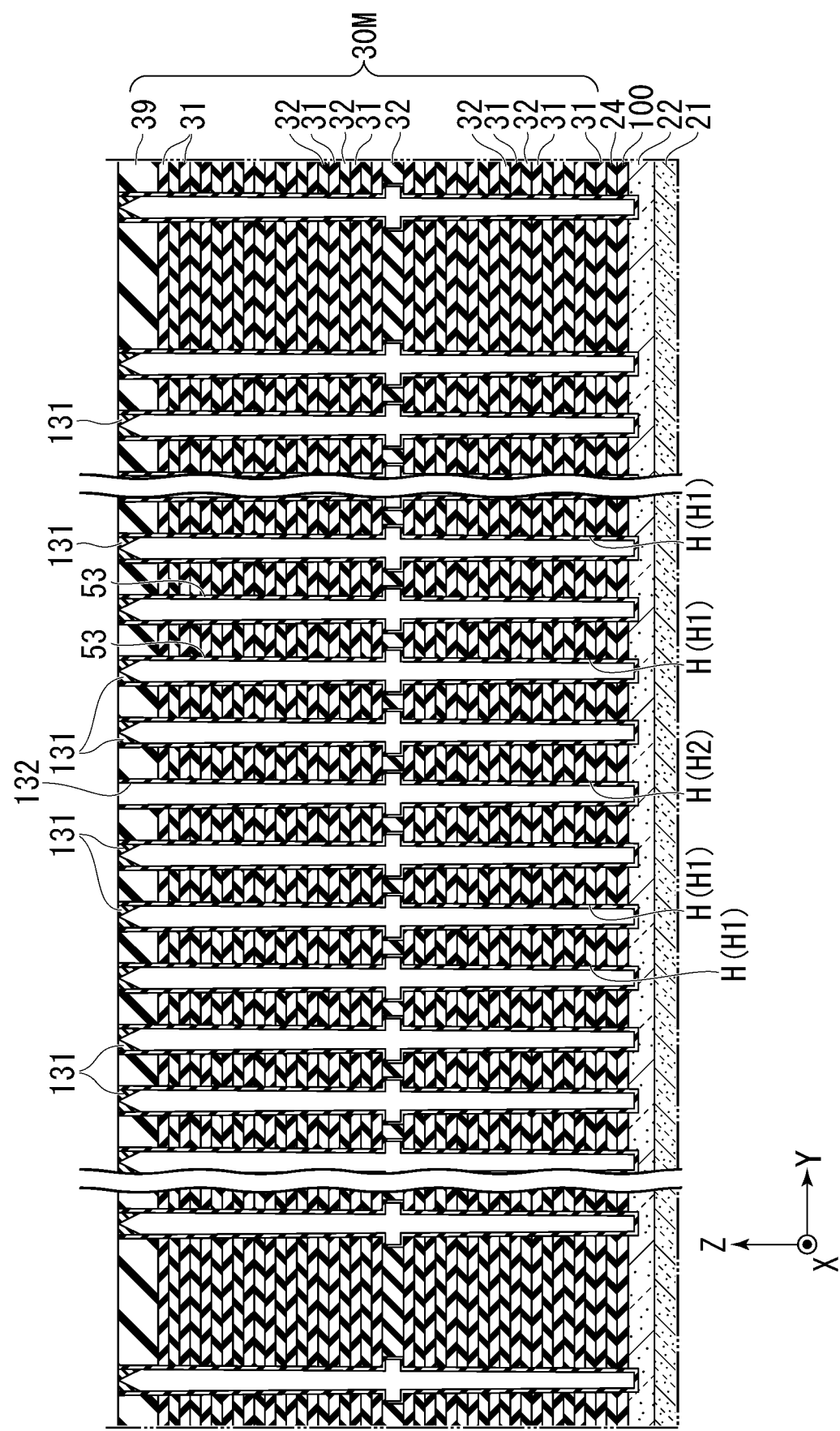
FIG. 20 is a cross-sectional view for explaining the second example of the manufacturing method according to the first embodiment.

Next, as shown in FIG. 20, an insulating layer 131 having poor coverage is formed on the intermediate multi-layered body 30M, and lid parts covering upper portions of all the holes H are formed. Next, in the insulating layer 131, an opening 132 is formed only at a position corresponding to the second hole H2 by, for example, reactive ion etching.

Figure 21:
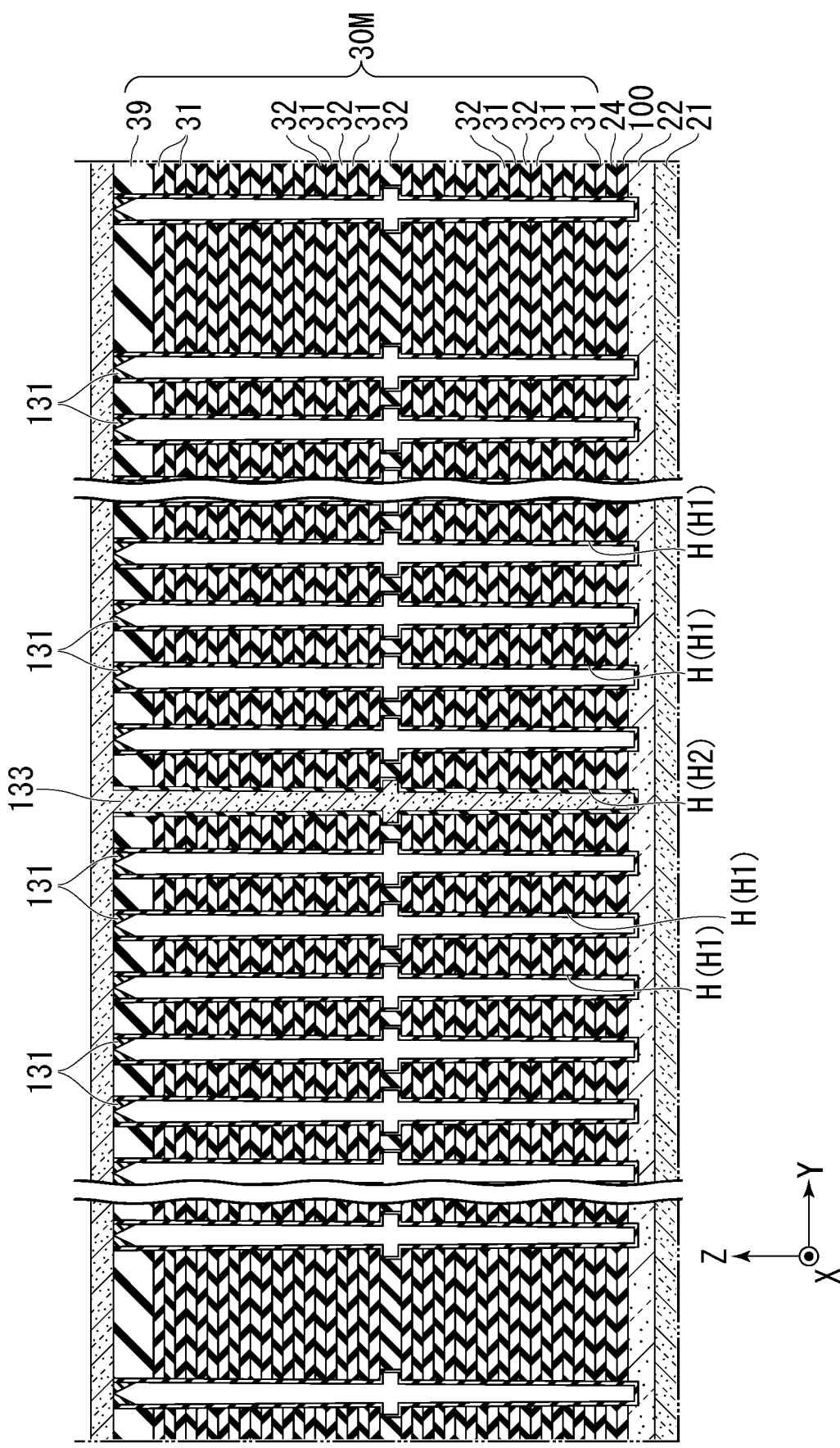
FIG. 21 is a cross-sectional view for explaining the second example of the manufacturing method according to the first embodiment.
Figure 22:
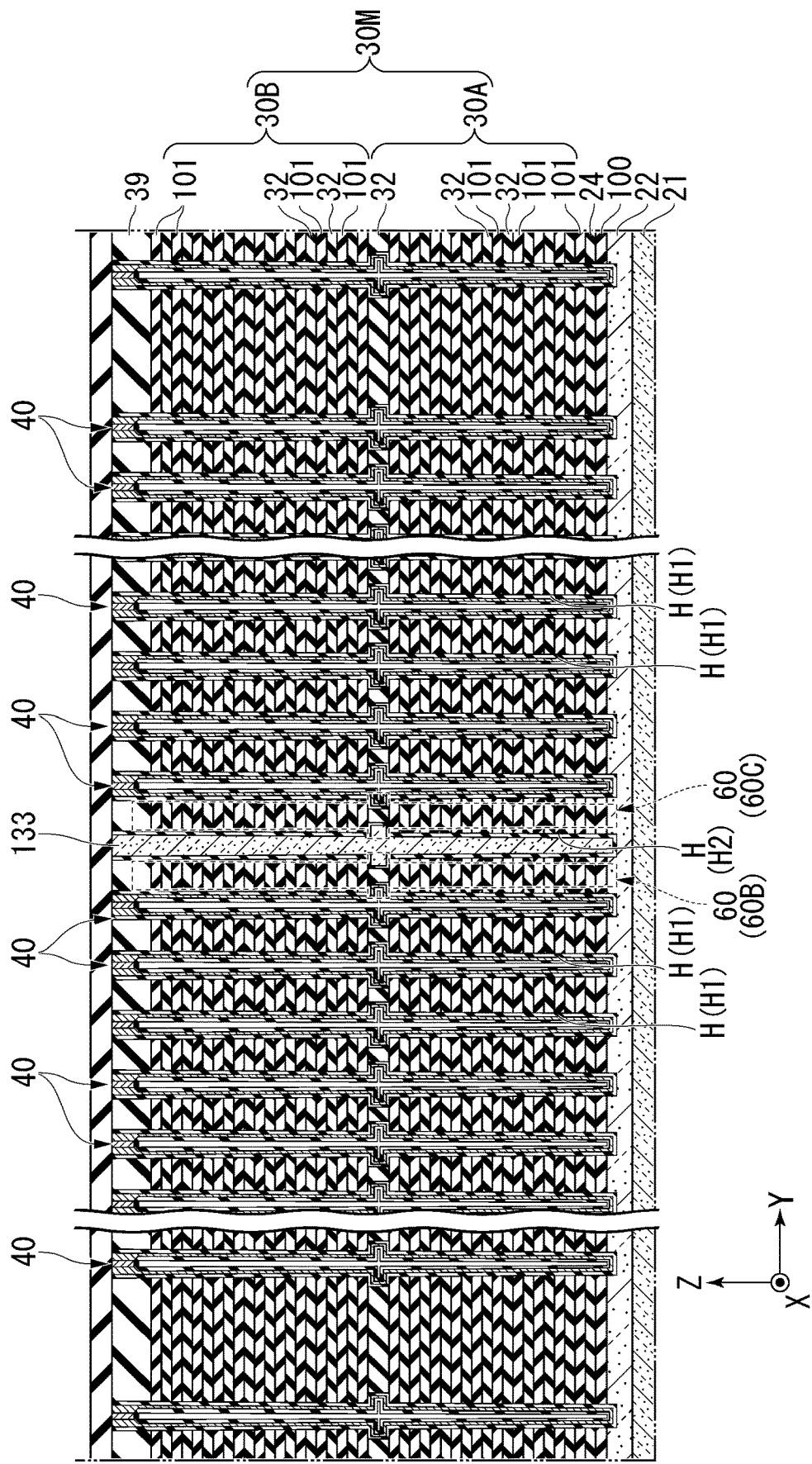
FIG. 22 is a cross-sectional view for explaining the second example of the manufacturing method according to the first embodiment.

Next, the inside of the second hole H2 is filled with a sacrificial body 133 as shown in FIG. 21. The sacrificial body 133 is formed of a semiconductor material such as, for example, amorphous silicon. Next, as shown in FIG. 22, materials of the charge trap film 52, the tunnel insulating film 51, the channel layer 42, and the insulating core 43 are sequentially supplied to the insides of the first hole H1 and the third hole H3 to form a MANOS structure. Therefore, the memory pillar 40, the second dividing pillar 60B, and the third dividing pillar 60C are formed at the same time.

Figure 23:
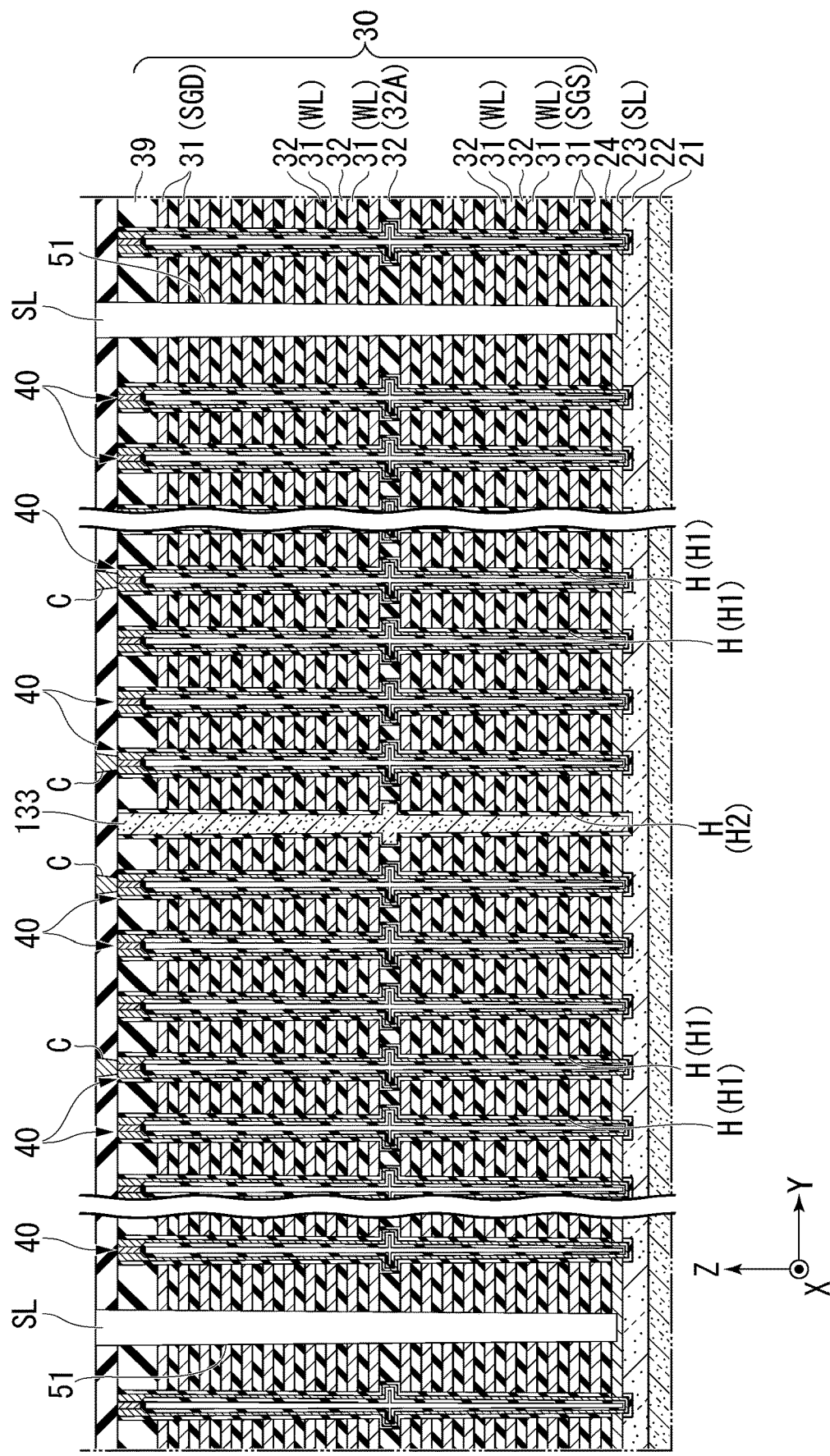
FIG. 23 is a cross-sectional view for explaining the second example of the manufacturing method according to the first embodiment.

Next, the slit SL is provided at a position corresponding to the dividing part ST as shown in FIG. 23. Then, the sacrificial layer 101 is removed by wet etching through the slit SL, and a conductive material such as tungsten is supplied to a space in which the sacrificial layer 101 has been present. Therefore, the sacrificial layer 101 is replaced with the conductive layer 31. In the present example, the conductive layer 31 is an example of the "first layer". The insulating layer 32 is an example of the "second layer". Also, the sacrificial layer 100 is removed by wet etching through the slit SL, and a conductive material such as tungsten is supplied to a space in which the sacrificial layer 100 has been present. Therefore, the sacrificial layer 100 is replaced with the conductive layer 23.

Figure 24:
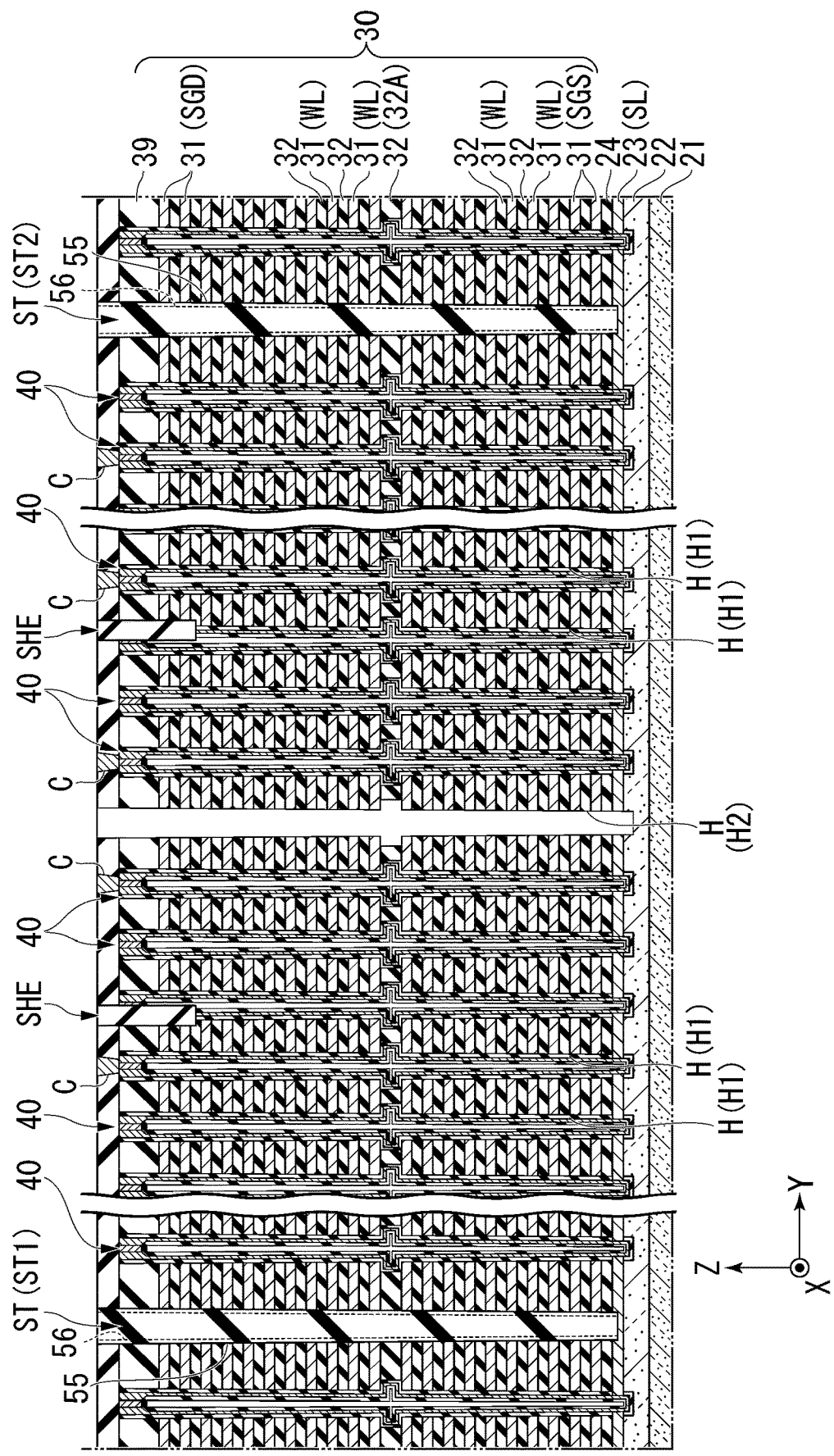
FIG. 24 is a cross-sectional view for explaining the second example of the manufacturing method according to the first embodiment.
Figure 25:
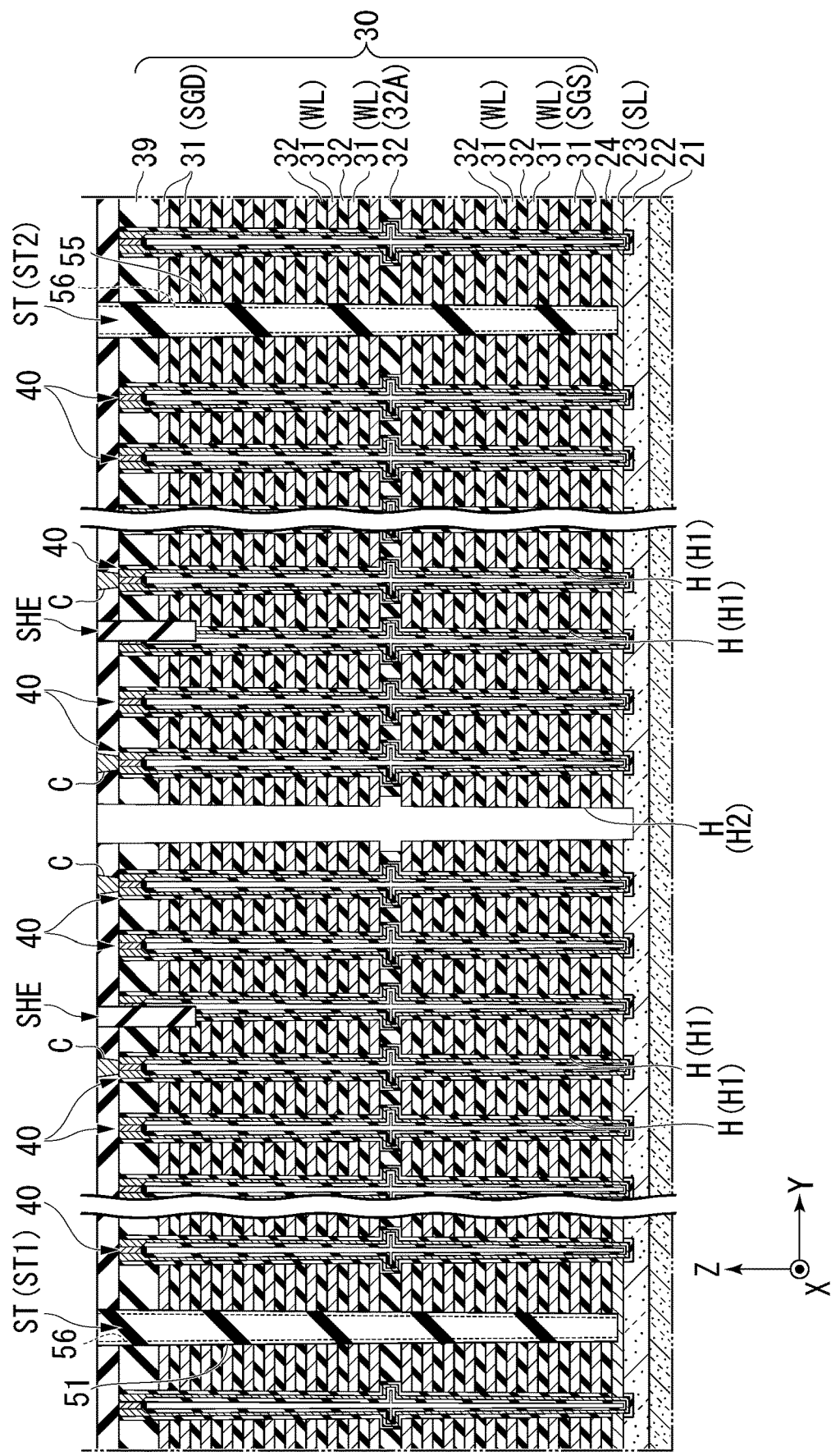
FIG. 25 is a cross-sectional view for explaining the second example of the manufacturing method according to the first embodiment.

Next, the sacrificial body 133 in the second hole H2 is removed by, for example, wet etching as shown in FIG. 24. Next, as shown in FIG. 25, the block insulating film 53 on an inner surface of the second hole H2 and an end portion of the conductive layer 31 adjacent to the block insulating film 53 are removed by wet etching through the second hole H2. Therefore, at positions corresponding to at least the plurality of the sacrificial layers 101, an inner diameter of the hole H2 is expanded so that the inner diameter of the hole H2 is larger than an inner diameter of the hole H1, and the inner diameter of the hole H2 is larger than an inner diameter of the hole H3. The expansion of the hole H2 need only be performed at least at a position corresponding to the conductive layer 31, and may not be performed at a position corresponding to the insulating layer 32.

Figure 26:
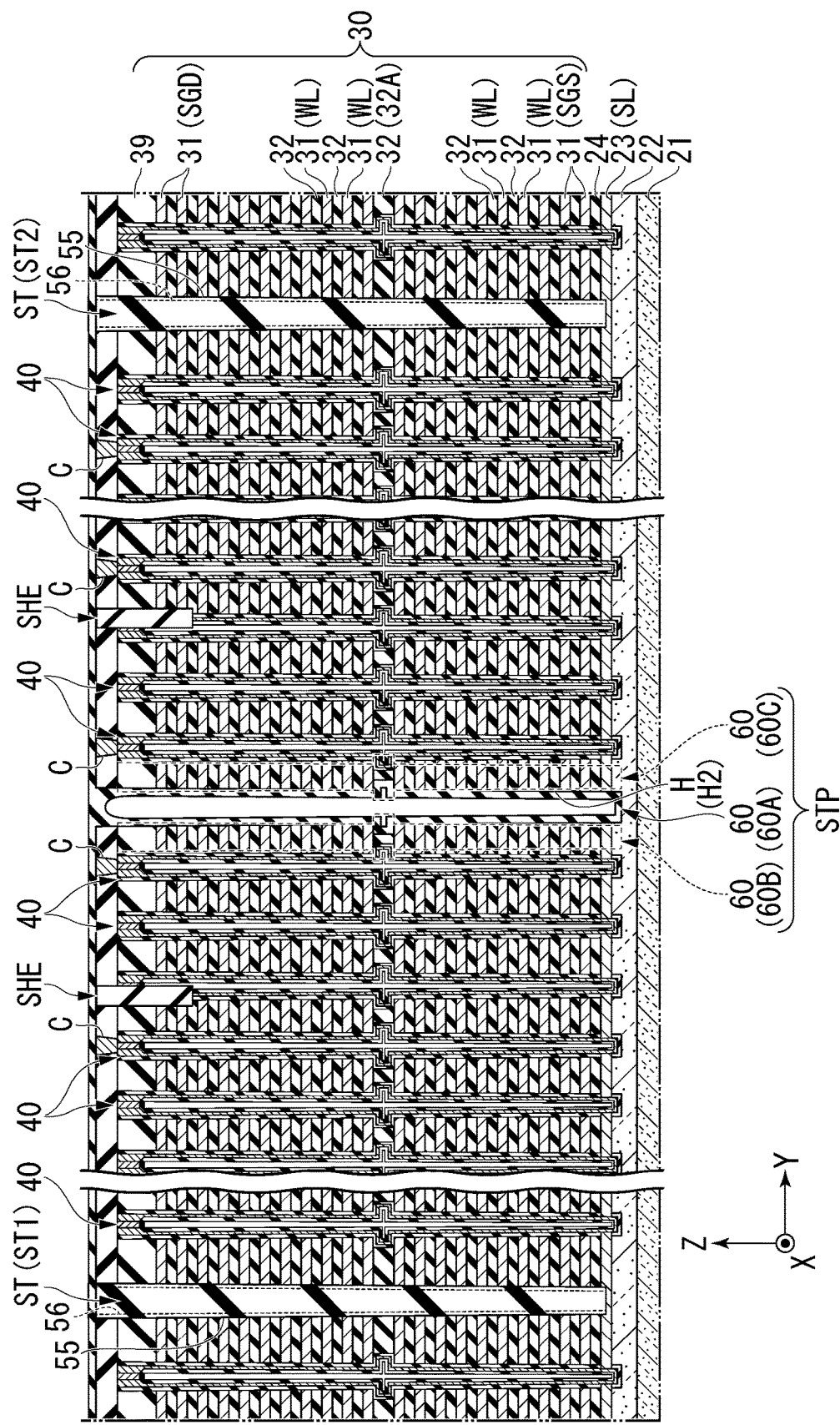
FIG. 26 is a cross-sectional view for explaining the second example of the manufacturing method according to the first embodiment.

Next, an insulating material is supplied to the inner surface of the second hole H2 to form the insulating part 61 as shown in FIG. 26. Therefore, the first dividing pillar 60A having the insulating part 61 is formed inside the second hole H2. The other manufacture of the semiconductor storage device 1 can be performed by, for example, a known method.

4. Advantages

As shown in FIG. 7, a shortest distance between two memory pillars 40 positioned separately on both sides of the dividing part ST is a distance L1. The reason for this is that the dividing part ST is formed by a process different from that of the memory pillar 40. Therefore, a large dimensional margin M in consideration of processing error is required between the dividing part ST and the memory pillar 40. Therefore, the shortest distance between two memory pillars 40 positioned separately on both sides of the dividing part ST is the distance L1.

On the other hand, the second hole H2 and the third hole H3 for forming the plurality of the dividing pillars 60 are processed at the same time as the first hole H1 for forming the memory pillar 40. Therefore, a dimensional margin between the second hole H2 and the third hole H3, and the first hole H1 may be smaller than the dimensional margin M described above. Therefore, when the dividing part STP is formed by the plurality of the dividing pillars 60, a shortest distance between two memory pillars 40 positioned separately on both sides of the dividing part STP is a distance L2 that is smaller than the distance L1. Therefore, according to the semiconductor storage device 1 in which the plurality of the dividing pillars 60 are provided, improvement in a degree of integration can be achieved.

In the embodiment, the plurality of the dividing pillars 60 include the plurality of the dividing pillars 60A disposed in the first row R2A, and the plurality of the dividing pillars 60B disposed in the second row R2B adjacent to the first row R2A in the Y direction. The outer circumferential portion 60AS of each of the plurality of the dividing pillars 60A is in contact with the outer circumferential portion 60BS of at least one dividing pillar 60B. According to such a configuration, the dividing part STP that is thick in the Y direction can be formed by the plurality of the dividing pillars 60A disposed in the first row R2A and the plurality of the dividing pillars 60B disposed in the second row R2B. Therefore, a withstand voltage between the conductive parts separated on both sides of the dividing part STP can be improved.

In the embodiment, the dimension L60A of each of the plurality of the dividing pillars 60A in the Y direction is larger than the dimension L40 of each of the plurality of the memory pillars 40 in the Y direction. According to such a configuration, it becomes easier to form the narrow structure due to the dividing pillar 60A having a large dimension.

In the embodiment, the dimension L60A of each of the plurality of the dividing pillars 60A in the Y direction is larger than the dimension L60B of each of the plurality of the dividing pillars 60B in the Y direction. According to such a configuration, it becomes easier to form the narrow structure due to the dividing pillar 60A having a large dimension.

In the embodiment, the dimension L60B of each of the plurality of the dividing pillars 60B in the Y direction is the same as the dimension L40 of each of the plurality of the memory pillars 40 in the Y direction. According to such a configuration, the dividing pillar 60B can be easily formed by the same process as the memory pillar 40.

In the embodiment, the outer circumferential portion 60AS of each of the plurality of the dividing pillars 60A is in contact with the outer circumferential portions 60BS of two dividing pillars 60B included in the plurality of the dividing pillars 60B. According to such a configuration, there is a portion disconnected from the conductive part between the dividing pillar 60A and the two dividing pillars 60B in contact with the dividing pillar 60A. Therefore, a withstand voltage between the conductive parts separated on both sides of the dividing part STP can be improved.

In the embodiment, the plurality of the dividing pillars 60 include a plurality of dividing pillars 60C disposed in the third row R2C adjacent to the first row R2A in the Y direction from a side opposite to the second row R2B. The outer circumferential portion 60AS of each of the plurality of the dividing pillars 60A is in contact with the outer circumferential portion 60BS of at least one dividing pillar 60B and the outer circumferential portion 60CS of at least one dividing pillar 60C. According to such a configuration, it is possible to form the dividing part STP that is thick in the Y direction by the plurality of the dividing pillars 60A disposed in the first row R2A, the plurality of the dividing pillars 60B disposed in the second row R2B, and the plurality of the dividing pillars 60C disposed in the third row R2C. Therefore, a withstand voltage between the conductive parts separated on both sides of the dividing part STP can be improved.

MODIFIED EXAMPLE

Next, one modified example will be described. Furthermore, configurations other than those described below are the same as the configurations of the first embodiment.

Figure 27:
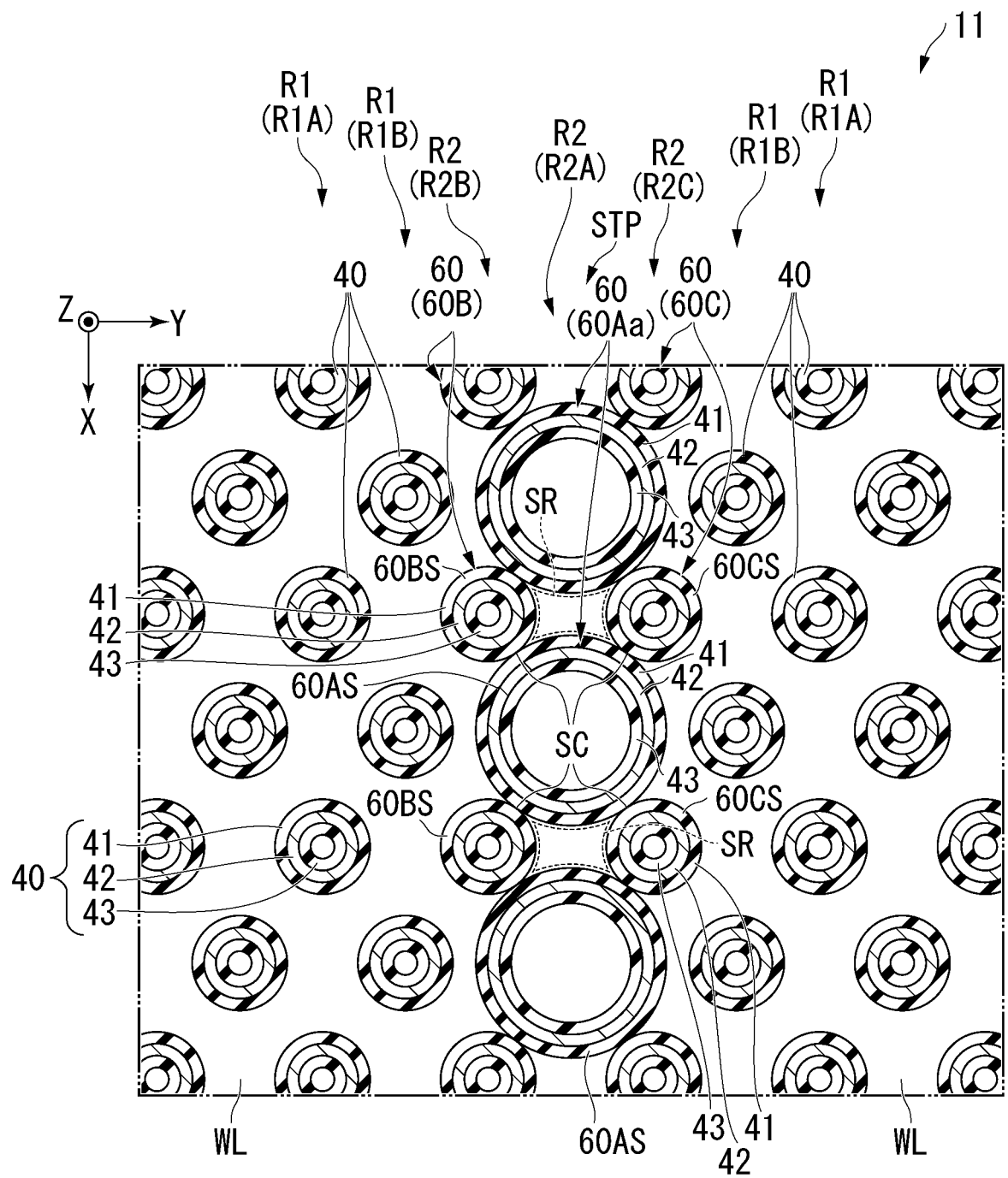
FIG. 27 is a cross-sectional view showing a part of a memory cell array according to a modified example of the first embodiment.

FIG. 27 is a cross-sectional view showing a part of a memory cell array 11A according to a modified example of the first embodiment. In the present modified example, the memory cell array 11A includes a first dividing pillar 60Aa instead of the first dividing pillar 60A. The first dividing pillar 60Aa has a MANOS structure similar to that of the memory pillar 40. That is, the first dividing pillar 60Aa includes the hollow insulating core 43, the channel layer 42, and the multilayer film 41 (that is, the tunnel insulating film 51, the charge trap film 52, and the block insulating film 53) in order from a central portion of the first dividing pillar 60Aa toward an outer circumferential side thereof. The block insulating film 53 includes an outer circumferential portion 60AS of the first dividing pillar 60Aa. Even with such a configuration, the dividing part STP can be formed by the dividing pillar 60.

Second Embodiment

Next, a second embodiment will be described. The second embodiment is different from the first embodiment in that a first dividing pillar 60Ab has an oval shape having a major axis in the Y direction. Furthermore, configurations other than those described below are the same as the configurations of the first embodiment.

Figure 28:
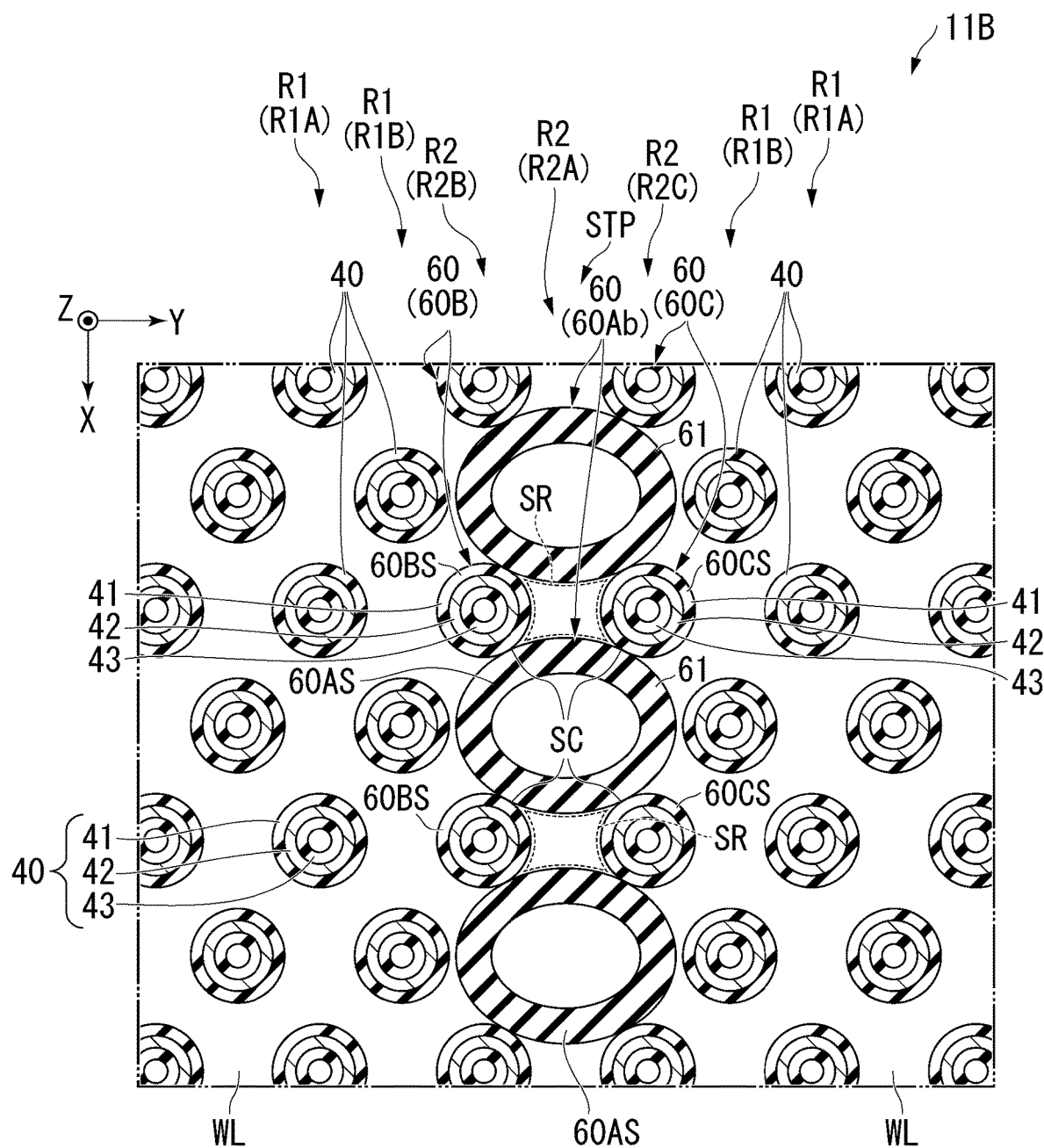
FIG. 28 is a cross-sectional view showing a part of a memory cell array according to a second embodiment.

FIG. 28 is a cross-sectional view showing a part of a memory cell array 11B according to the second embodiment. In the embodiment, the memory cell array 11B includes the first dividing pillar 60Ab instead of the first dividing pillar 60A. The first dividing pillar 60Ab has an oval shape having a major axis in the Y direction. According to such a configuration, an outer circumferential portion 60AS of the first dividing pillar 60Ab can be more easily in contact with an outer circumferential portion 60BS of a second dividing pillar 60B or an outer circumferential portion 60BC of a third dividing pillar 60C.

Third Embodiment

Next, a third embodiment will be described. The third embodiment is different from the first embodiment in that a first dividing pillar 60Ac has an oval shape having a major axis in the X direction. Furthermore, configurations other than those described below are the same as the configurations of the first embodiment.

Figure 29:
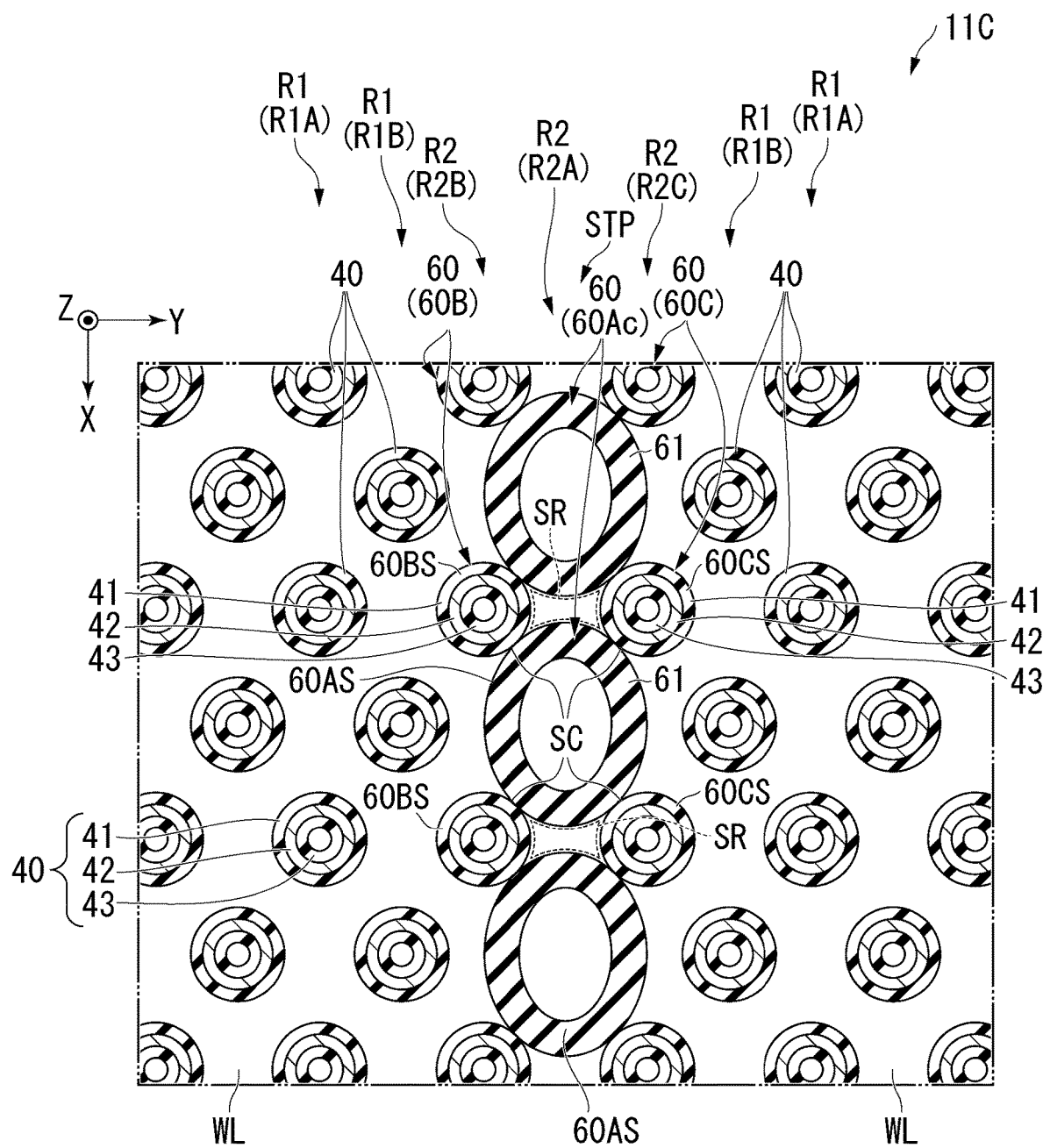
FIG. 29 is a cross-sectional view showing a part of a memory cell array according to a third embodiment.

FIG. 29 is a cross-sectional view showing a part of a memory cell array 11C according to the third embodiment. In the embodiment, the memory cell array 11C includes the first dividing pillar 60Ac instead of the first dividing pillar 60A. The first dividing pillar 60Ac has an oval shape having a major axis in the X direction. According to such a configuration, an outer circumferential portion 60AS of the first dividing pillar 60Ac can be more easily in contact with an outer circumferential portion 60BS of a second dividing pillar 60B or an outer circumferential portion 60BC of a third dividing pillar 60C, and a distance between the first dividing pillar 60Ac and a memory pillar 40 positioned in the vicinity of the first dividing pillar 60Ac can be easily secured. Therefore, an influence of manufacture of the first dividing pillar 60Ac on the memory pillar 40 can be more reliably suppressed.

Fourth Embodiment

Next, a fourth embodiment will be described. The fourth embodiment is different from the first embodiment in that a first dividing pillar 60Ad has an oval shape having a major axis in the X direction. Furthermore, configurations other than those described below are the same as the configurations of the first embodiment.

Figure 30:
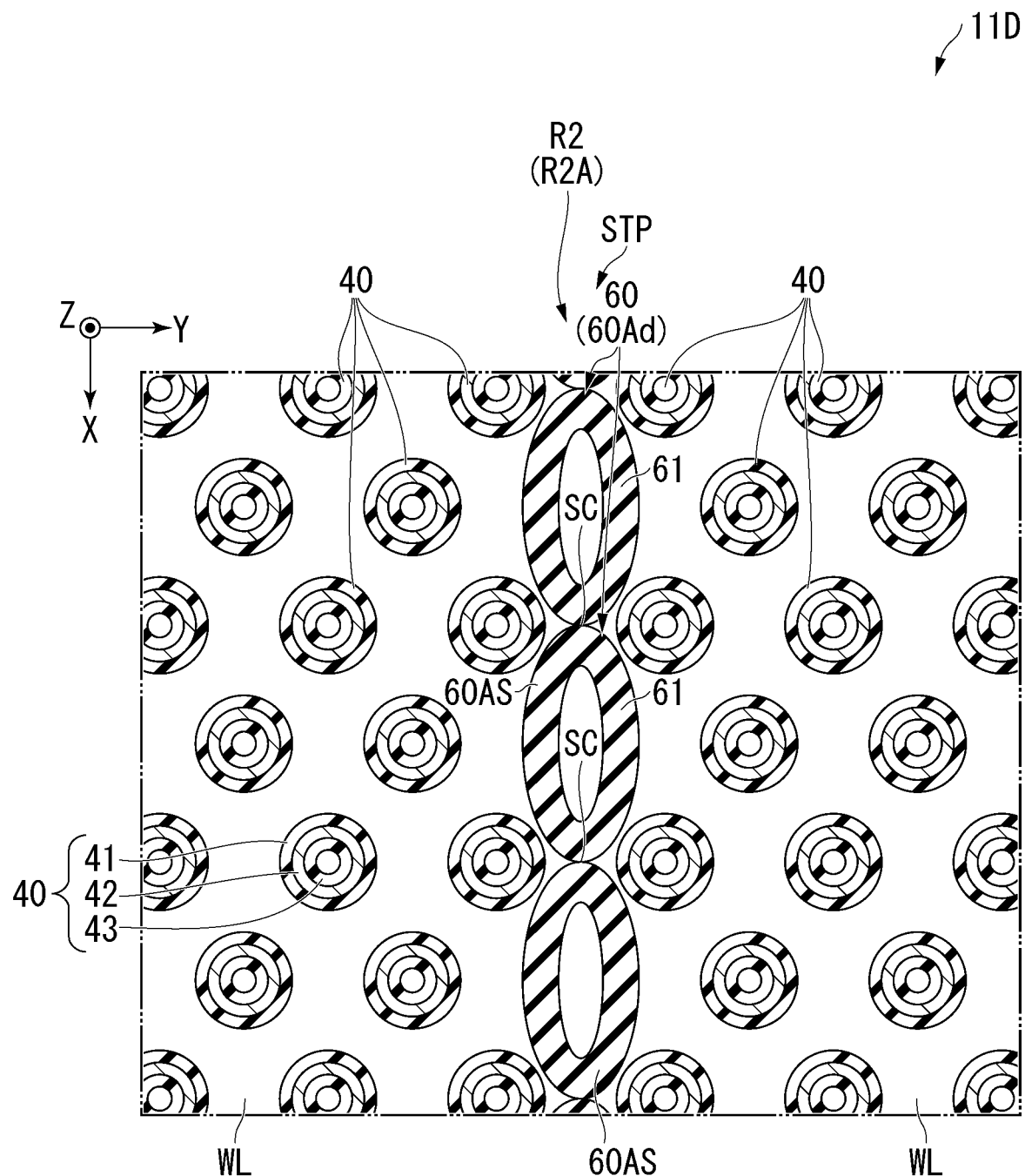
FIG. 30 is a cross-sectional view showing a part of a memory cell array according to a fourth embodiment.

FIG. 30 is a cross-sectional view showing a part of the memory cell array 11D of the fourth embodiment. Furthermore, FIG. 30 is a cross-sectional view at a position corresponding to, for example, a word line WL in a lowermost layer (see arrow A in FIG. 4). In the embodiment, the memory cell array 11D includes a first dividing pillar 60Ad instead of the first dividing pillar 60A. In the embodiment, the first dividing pillar 60Ad has an oval shape having a major axis in the X direction. Outer circumferential portions 60AS of a plurality of first dividing pillars 60Ad aligned in the X direction are in contact with each other.

In the embodiment, the outer circumferential portion 60AS of each of the plurality of the first dividing pillars 60Ad is in contact with the outer circumferential portions 60AS of two adjacent first dividing pillars 60Ad included in the plurality of the first dividing pillars 60Ad. Furthermore, the first dividing pillar 60Ad is not limited to the case of being in contact with the outer circumferential portions 60AS of two adjacent first dividing pillars 60Ad, and may be in contact with only the outer circumferential portion 60AS of one adjacent first dividing pillar 60Ad.

Figure 31:
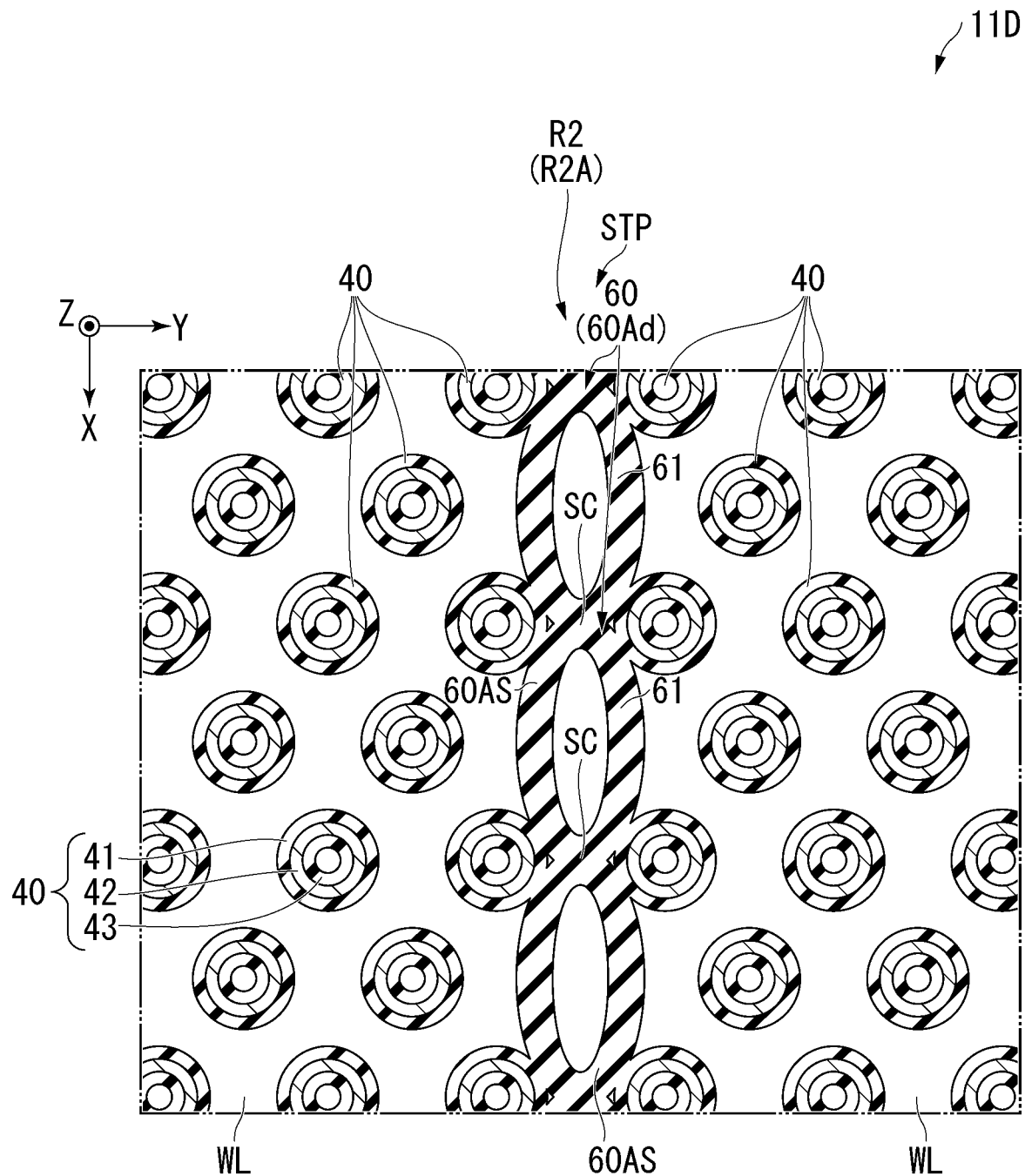
FIG. 31 is a cross-sectional view showing a part of the memory cell array of the fourth embodiment.

FIG. 31 is a cross-sectional view showing a part of the memory cell array 11D of the fourth embodiment. Furthermore, FIG. 31 is a cross-sectional view at a position corresponding to, for example, a word line WL in an uppermost layer (see arrow B in FIG. 4). That is, FIG. 31 is a cross-sectional view at a portion in which the first dividing pillar 60Ad is the thickest. In the embodiment, the structure described with reference to FIG. 8 is realized from an upper end portion to a lower end portion of the first dividing pillar 60Ad.

In the embodiment, a second dividing pillar 60B and a third dividing pillar 60C may be omitted. According to such a configuration, higher integration can be achieved by omitting, for example, the second dividing pillar 60B and the third dividing pillar 60C.

While some embodiments and modified examples have been described above, the embodiments are not limited to the above examples. For example, the modified example of the first embodiment may be realized in combination with the second embodiment or the third embodiment.

According to at least one embodiment described above, the semiconductor storage device includes the plurality of the first columnar bodies. The plurality of the first columnar bodies have insulating properties at least in the outer circumferential portions, and divide each of the plurality of the gate electrode layers into a plurality of regions. According to such a configuration, improvement in a degree of integration can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a multi-layered body including a plurality of gate electrode layers and a plurality of insulating layers, the plurality of the gate electrode layers and the plurality of the insulating layers being alternately stacked one layer by one layer in a first direction in the multi-layered body;
   a first dividing part penetrating the multi-layered body in the first direction, the first dividing part extending in a second direction, the first dividing part dividing each of the plurality of the gate electrode layers in a third direction, the second direction being different from the first direction, the third direction being different from the first direction and the second direction;
a second dividing part separated from the first dividing part in the third direction, the second dividing part penetrating the multi-layered body in the first direction, the second dividing part dividing each of the plurality of the gate electrode layers in the third direction;
a third dividing part between the first dividing part and the second dividing part, the third dividing part dividing each of the plurality of the gate electrode layers in the third direction, the third dividing part including a plurality of first columnar bodies, the plurality of the first columnar bodies extending in the first direction in the multi-layered body, the plurality of the first columnar bodies having outer circumferential portions, the plurality of the first columnar bodies having insulating properties at least in the outer circumferential portions of the plurality of the first columnar bodies, the plurality of the first columnar bodies being aligned in the second direction;
a plurality of second columnar bodies between the first dividing part and the third dividing part, the plurality of the second columnar bodies extending in the first direction in the multi-layered body, each of the plurality of the second columnar bodies including a charge storage and a channel layer; and
a plurality of third columnar bodies between the second dividing part and the third dividing part, the plurality of the third columnar bodies extending in the first direction in the multi-layered body, each of the plurality of the third columnar bodies including a charge storage and a channel layer, wherein
a width of each of the plurality of the first columnar bodies in the second direction is larger than a distance between two second columnar bodies adjacent in the second direction included in the plurality of the second columnar bodies or larger than a distance between two third columnar bodies adjacent in the second direction included in the plurality of the third columnar bodies,
the third dividing part further includes a plurality of fourth columnar bodies,
the plurality of the fourth columnar bodies extend in the first direction in the multi-layered body,
the plurality of the fourth columnar bodies have outer circumferential portions,
the plurality of the fourth columnar bodies have insulating properties at least in the outer circumferential portions of the plurality of the fourth columnar bodies,
the plurality of the fourth columnar bodies are aligned in the second direction,
each of the outer circumferential portions of the plurality of the first columnar bodies is in contact with outer circumferential portions of two fourth columnar bodies included in the plurality of the fourth columnar bodies,
the third dividing part further includes a plurality of fifth columnar bodies,
the plurality of the fifth columnar bodies extend in the first direction in the multi-layered body,
the plurality of the fifth columnar bodies have outer circumferential portions,
the plurality of the fifth columnar bodies have insulating properties at least in the outer circumferential portions of the plurality of the fifth columnar bodies,
the plurality of the fifth columnar bodies are aligned in the second direction, and
each of the outer circumferential portions of the plurality of the first columnar bodies is in contact with outer circumferential portions of two fifth columnar bodies included in the plurality of the fifth columnar bodies.

2. The semiconductor storage device according to claim 1, wherein
each of the outer circumferential portions of the plurality of the first columnar bodies is in contact with outer circumferential portions of two adjacent first columnar bodies included in the plurality of the first columnar bodies.

3. The semiconductor storage device according to claim 1, wherein
a width of each of the plurality of the first columnar bodies in the third direction is larger than a width of each of the plurality of the second columnar bodies in the third direction.

4. The semiconductor storage device according to claim 1, wherein
a width of each of the plurality of the first columnar bodies in the third direction is larger than a width of each of the plurality of the fourth columnar bodies in the third direction.

5. The semiconductor storage device according to claim 4, wherein
a width of each of the plurality of the fourth columnar bodies in the third direction is the same as a width of each of the plurality of the second columnar bodies in the third direction.

6. A semiconductor storage device comprising:
a multi-layered body including a plurality of gate electrode layers and a plurality of insulating layers, the plurality of the gate electrode layers and the plurality of the insulating layers being alternately stacked one layer by one layer in a first direction in the multi-layered body;
a first dividing part penetrating the multi-layered body in the first direction, the first dividing part extending in a second direction, the first dividing part dividing each of the plurality of the gate electrode layers in a third direction, the second direction being different from the first direction, the third direction being different from the first direction and the second direction;
a second dividing part separated from the first dividing part in the third direction, the second dividing part penetrating the multi-layered body in the first direction, the second dividing part dividing each of the plurality of the gate electrode layers in the third direction;
a plurality of first columnar bodies between the first dividing part and the second dividing part, the plurality of the first columnar bodies having outer circumferential portions, the plurality of the first columnar bodies having insulating properties at least in the outer circumferential portions of the plurality of the first columnar bodies, the plurality of the first columnar bodies being aligned in the second direction;
a plurality of second columnar bodies between the first dividing part and the plurality of the first columnar bodies, the plurality of the second columnar bodies extending in the first direction in the multi-layered body, each of the plurality of the second columnar bodies including a charge storage and a channel layer;
a plurality of third columnar bodies between the second dividing part and the plurality of the first columnar bodies, the plurality of the third columnar bodies extending in the first direction in the multi-layered body, each of the plurality of the third columnar bodies including a charge storage and a channel layer; and a plurality of fourth columnar bodies between the plurality of the first columnar bodies and the plurality of the second columnar bodies, the plurality of the fourth columnar bodies having outer circumferential portions, the plurality of the fourth columnar bodies having insulating properties at least in the outer circumferential portions of the plurality of the fourth columnar bodies, the plurality of the fourth columnar bodies being aligned in the second direction, wherein each of the outer circumferential portions of the plurality of the first columnar bodies is in contact with outer circumferential portions of two fourth columnar bodies included in the plurality of the fourth columnar bodies, the semiconductor storage device further comprises:
  a plurality of fifth columnar bodies between the plurality of the first columnar bodies and the plurality of the third columnar bodies, the plurality of the fifth columnar bodies having outer circumferential portions; and
  the plurality of the fifth columnar bodies having insulating properties at least in the outer circumferential portions of the plurality of the fifth columnar bodies, the plurality of the fifth columnar bodies being aligned in the second direction, and wherein
each of the outer circumferential portions of the plurality of the first columnar bodies is in contact with outer circumferential portions of two fifth columnar bodies included in the plurality of the fifth columnar bodies.

7. A method of manufacturing a semiconductor storage device comprising:
  preparing a multi-layered body including a plurality of first layers and a plurality of second layers, each of the plurality of the first layers having a material different from that of the plurality of the second layers, the plurality of the first layers and the plurality of the second layers being alternately stacked one layer by one layer in a first direction, the plurality of the first layers having end portions, the multi-layered body having a plurality of holes penetrating the plurality of the first layers and the plurality of the second layers in the first direction, the plurality of the holes having a plurality of first holes and a plurality of second holes;
  forming a first dividing part penetrating the multi-layered body in the first direction, the first dividing part extending in a second direction, the first dividing part dividing each of the plurality of the gate electrode layers in a third direction, the second direction being different from the first direction, the third direction being different from the first direction and the second direction;
  forming a second dividing part separated from the first dividing part in the third direction, the second dividing part penetrating the multi-layered body in the first direction, the second dividing part dividing each of the plurality of the gate electrode layers in the third direction;
  forming a third dividing part between the first dividing part and the second dividing part, the third dividing part dividing each of the plurality of the gate electrode layers in the third direction, the third dividing part including a plurality of first columnar bodies, the plurality of the first columnar bodies extending in the first direction in the multi-layered body, the plurality of the first columnar bodies having outer circumferential portions, the plurality of the first columnar bodies having insulating properties at least in the outer circumferential portions of the plurality of the first columnar bodies, the plurality of the first columnar bodies being aligned in the second direction;
  forming a plurality of second columnar bodies between the first dividing part and the third dividing part and inside the plurality of the first holes, each of the plurality of the second columnar bodies including a charge storage and a channel layer;
  forming a plurality of third columnar bodies between the second dividing part and the third dividing part, the plurality of the third columnar bodies extending in the first direction in the multi-layered body, each of the plurality of the third columnar bodies including a charge storage and a channel layer,
  expanding inner diameters of the plurality of the second holes such that an inner diameter of each of the plurality of the second holes is larger than an inner diameter of each of the plurality of the first holes at least at positions corresponding to the plurality of the first layers, by removing the end portions of the plurality of the first layers by etching, the end portions of the plurality of the first layers being exposed in the plurality of the second holes; and
  forming a plurality of first columnar bodies inside the plurality of the second holes, the plurality of the first columnar bodies having outer circumferential portions, the plurality of the first columnar bodies having insulating properties at least in the outer circumferential portions of the plurality of the first columnar bodies, wherein
a width of each of the plurality of the first columnar bodies in the second direction is larger than a distance between two second columnar bodies adjacent in the second direction included in the plurality of the second columnar bodies or larger than a distance between two third columnar bodies adjacent in the second direction included in the plurality of the third columnar bodies, the third dividing part further includes a plurality of fourth columnar bodies, the plurality of the fourth columnar bodies extend in the first direction in the multi-layered body, the plurality of the fourth columnar bodies have outer circumferential portions, the plurality of the fourth columnar bodies have insulating properties at least in the outer circumferential portions of the plurality of the fourth columnar bodies, the plurality of the fourth columnar bodies are aligned in the second direction, each of the outer circumferential portions of the plurality of the first columnar bodies is in contact with outer circumferential portions of two fourth columnar bodies included in the plurality of the fourth columnar bodies, the third dividing part further includes a plurality of fifth columnar bodies, the plurality of the fifth columnar bodies extend in the first direction in the multi-layered body, the plurality of the fifth columnar bodies have outer circumferential portions, the plurality of the fifth columnar bodies have insulating properties at least in the outer circumferential portions of the plurality of the fifth columnar bodies, the plurality of the fifth columnar bodies are aligned in the second direction, and each of the outer circumferential portions of the plurality of the first columnar bodies is in contact with outer circumferential portions of two fifth columnar bodies included in the plurality of the fifth columnar bodies.

8. The method of manufacturing a semiconductor storage device according to claim 7, wherein
- the first layer is a sacrificial layer,
- the sacrificial layer is replaced with a conductive layer in a subsequent process, and
- expansion of the inner diameters of the plurality of the second holes and formation of the plurality of the first columnar bodies are performed before the sacrificial layer is replaced with the conductive layer.

9. The method of manufacturing a semiconductor storage device according to claim 7, wherein
- the first layer is a conductive layer formed by being replaced with a sacrificial layer, and
- expansion of the inner diameters of the plurality of the second holes and formation of the plurality of the first columnar bodies are performed after the sacrificial layer is replaced with the conductive layer.

* * * * *